United States Patent
Ahn et al.

(10) Patent No.: US 12,135,897 B2
(45) Date of Patent: Nov. 5, 2024

(54) MEMORY CONTROLLER, A STORAGE DEVICE, AND AN OPERATING METHOD OF THE STORAGE DEVICE PRELIMINARY CLASS

(71) Applicant: SAMSUNG ELECTRONICS CO., LTD., Suwon-si (KR)

(72) Inventors: Hyojin Ahn, Suwon-si (KR); Seoyeong Lee, Suwon-si (KR); Dongwoo Shin, Suwon-si (KR); Changjun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 11 days.

(21) Appl. No.: 18/137,036

(22) Filed: Apr. 20, 2023

(65) Prior Publication Data
US 2024/0069790 A1    Feb. 29, 2024

(30) Foreign Application Priority Data
Aug. 25, 2022 (KR) .................. 10-2022-0107180

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC .... G06F 3/0655; G06F 3/0604; G06F 3/0679; G06F 12/0246
See application file for complete search history.

(56) References Cited

U.S. PATENT DOCUMENTS

| | | |
|---|---|---|
| 8,605,505 B2 | 12/2013 | Kim |
| 9,390,806 B1 | 7/2016 | Hong |
| 9,576,671 B2 | 2/2017 | Karakulak et al. |
| 9,852,804 B2 | 12/2017 | Park et al. |
| 10,120,589 B2 | 11/2018 | Jung |
| 10,566,061 B2 | 2/2020 | Karakulak et al. |

(Continued)

FOREIGN PATENT DOCUMENTS

| | | |
|---|---|---|
| KR | 10-2017-0086173 | 7/2017 |
| KR | 10-2020-0019385 | 2/2020 |
| KR | 10-2420588 | 7/2022 |

*Primary Examiner* — Edward J Dudek, Jr.
(74) *Attorney, Agent, or Firm* — F. CHAU & ASSOCIATES, LLC

(57) ABSTRACT

An operating method of a storage device including a memory controller and a non-volatile memory, the method including: performing a first read in response to a read request by reading data from the non-volatile memory using a default read voltage set; and performing a second read when the first read fails, by calculating a degradation compensation level, using a weight table, offset table, and displacement level, calculating a history read voltage set by performing an operation on the default read voltage set and degradation compensation level, and reading the data using the history read voltage set, wherein the weight table includes weights preset according to word line groups and state read voltages, the offset table includes offset levels preset according to the word line groups and the state read voltages, and the displacement level corresponds to a difference between a default read voltage level and an optimal read voltage level.

20 Claims, 25 Drawing Sheets

(56) References Cited

U.S. PATENT DOCUMENTS

| | | | |
|---|---|---|---|
| 10,930,358 B2 | 2/2021 | Kim et al. | |
| 11,004,517 B2 | 5/2021 | Lee et al. | |
| 11,513,879 B2* | 11/2022 | Mehta | G11C 16/14 |
| 2019/0362796 A1* | 11/2019 | Choi | G11C 16/14 |
| 2020/0160920 A1 | 5/2020 | Karakulak et al. | |
| 2021/0043261 A1* | 2/2021 | Yu | G11C 16/24 |
| 2021/0166774 A1 | 6/2021 | Cha et al. | |
| 2022/0180932 A1* | 6/2022 | Secatch | G11C 16/102 |
| 2022/0245028 A1* | 8/2022 | Okamoto | G11C 11/5642 |
| 2022/0365706 A1* | 11/2022 | Yang | G11C 29/76 |
| 2022/0406382 A1* | 12/2022 | Komatsu | G11C 16/3409 |
| 2024/0055052 A1* | 2/2024 | Lien | G11C 16/102 |

* cited by examiner

FIG. 14A

| α | RP1 | RP2 | RP3 | RP4 | RP5 | RP6 | RP7 |
|---|---|---|---|---|---|---|---|
| R1 (WL0~WL11) | 1.2 | 1.3 | 3.1 | 3.9 | 2 | 1.6 | 1.4 |
| R2 (WL12~WL27) | 1.2 | 1.3 | 3 | 4 | 2 | 1.6 | 1.4 |
| ⋮ | ⋮ | ⋮ | ⋮ | ⋮ | ⋮ | ⋮ | ⋮ |
| RN (WL189~WL200) | 1.2 | 1.3 | 2.2 | 1.1 | 1.5 | 1.3 | 1 |

FIG. 14B

| β | RP1 | RP2 | RP3 | RP4 | RP5 | RP6 | RP7 |
|---|---|---|---|---|---|---|---|
| R1 (WL0~WL11) | −30 | −30 | −30 | −30 | −30 | −30 | −30 |
| R2 (WL12~WL27) | −35 | −20 | −45 | −45 | −45 | −45 | −40 |
| ⋮ | ⋮ | ⋮ | ⋮ | ⋮ | ⋮ | ⋮ | ⋮ |
| RN (WL189~WL200) | −20 | −20 | −10 | 0 | 0 | 0 | −20 |

MEMORY CONTROLLER, A STORAGE DEVICE, AND AN OPERATING METHOD OF THE STORAGE DEVICE PRELIMINARY CLASS

CROSS-REFERENCE TO RELATED APPLICATION

This application claims priority under 35 U.S.C. § 119 to Korean Patent Application No. 10-2022-0107180, filed on Aug. 25, 2022, in the Korean Intellectual Property Office, the disclosure of which is incorporated by reference herein in its entirety.

TECHNICAL FIELD

The inventive concept relates to an electronic device, and more particularly, to a memory controller, a storage device, and an operating method of the storage device.

DISCUSSION OF RELATED ART

Semiconductor memory devices can be divided into two categories: volatile memory and non-volatile memory. Volatile memory, such as dynamic random access memory (DRAM) or static RAM (SRAM) requires a continuous power supply to maintain stored data. On the other hand, non-volatile memory, such as electrically erasable programmable read-only memory (EEPROM), ferroelectric RAM (FRAM), phase-change RAM (PRAM), magnetic RAM (MRAM), or flash memory can retain data even when power is cut off.

Non-volatile memory is utilized in a range of devices such as an MP3 player, a digital camera, a cellular phone, a camcorder, a flash card, and a solid-state drive (or a solid-state disk) (SSD). As the demand for non-volatile memory in storage devices grows, its capacity is rapidly expanding.

SUMMARY

The inventive concept provides a memory controller for calculating a compensation value for read voltage compensation per word line, a storage device, and an operating method of the storage device.

According to an embodiment of the inventive concept, there is provided an operating method of a storage device including a memory controller and a non-volatile memory, the operating method including: performing a first read operation in response to a read request of a host by reading data from the non-volatile memory based on a default read voltage set; and performing a second read operation when the first read operation fails, by calculating a degradation compensation level, based on at least one weight table, at least one offset table, and a displacement level, calculating a history read voltage set by performing an operation on the default read voltage set and the degradation compensation level, and reading the data based on the history read voltage set, wherein the at least one weight table includes weights preset according to word line groups and state read voltages, the at least one offset table includes offset levels preset according to the word line groups and the state read voltages, and the displacement level corresponds to a difference between a default read voltage level in the default read voltage set and an optimal read voltage level in an optimal read voltage set.

According to an embodiment of the inventive concept, there is provided a memory controller for controlling a non-volatile memory including a plurality of word lines, the memory controller including: a memory storing at least one weight table including weights corresponding to word line groups and state read voltages, at least one offset table including offset levels corresponding to the word line groups and the state read voltages, and a displacement level corresponding to a difference between a default read voltage level in a default read voltage set and an optimal read voltage level in an optimal read voltage set; and a read manager configured to control the non-volatile memory to read data from the non-volatile memory in response to a read request of a host, wherein the read manager is further configured to calculate a degradation compensation level based on the at least one weight table, the at least one offset table, and the displacement level, calculate a history read voltage set by performing an operation on the default read voltage set and the degradation compensation level, and control the non-volatile memory to perform a history read operation by reading the data based on the history read voltage set.

According to an embodiment of the inventive concept, there is provided a storage device including; a non-volatile memory including a plurality of memory blocks each connected to a plurality of word lines; and a memory controller configured to control the non-volatile memory to read data from the non-volatile memory in response to a read request of a host, wherein the memory controller is further configured to calculate a degradation compensation level, based on a weight table, an offset table, and a displacement level, the weight table including weights corresponding to word line groups and state read voltages, the offset table including offset levels corresponding to the word line groups and the state read voltages, and the displacement level corresponding to a difference between a default read voltage level in a default read voltage set and an optimal read voltage level in an optimal read voltage set, calculate a history read voltage set by performing an operation on the default read voltage set and the degradation compensation level, and control the non-volatile memory to read the data based on the history read voltage set.

According to an embodiment of the inventive concept, there is provided an operating method of a storage device providing stored data in response to a read request of a host, the operating method including: calculating a degradation compensation level, by using a weight table, an offset table, and a displacement level, the weight table including weights preset according to word line groups and state read voltages, the offset table including offset levels preset according to the word line groups and the state read voltages, and the displacement level represents a difference between a default read voltage level and an optimal read voltage level; calculating a history read voltage level by performing an operation on the default read voltage level and the degradation compensation level; and performing a history read operation by reading the stored data, based on the history read voltage level.

According to an embodiment of the inventive concept, there is provided an operating method of a storage device providing data stored therein in response to a read request of a host, the operating method including: calculating a displacement level representing a difference between a default read voltage level and an optimal read voltage level, wherein the optimal read voltage is searched for by a recovery code executed by the storage device; calculating a degradation compensation level, by using at least one weight table, at least one offset table, and the displacement level, the at least one weight table including weights organized according to word line groups and state read voltages, and the at least one offset table including offset levels organized according to the word line groups and the state read voltages; and reading the data, based on the default read voltage level and the degradation compensation level.

BRIEF DESCRIPTION OF THE DRAWINGS

Embodiments of the inventive concept will be more clearly understood from the following detailed description taken in conjunction with the accompanying drawings in which:

FIGS. 14A and 14B are diagrams respectively showing a weight table and an offset table, according to an embodiment of the inventive concept;

DETAILED DESCRIPTION OF THE EMBODIMENTS

Hereinafter, embodiments of the inventive concept are described in detail with reference to the accompanying drawings.

Figure 1:
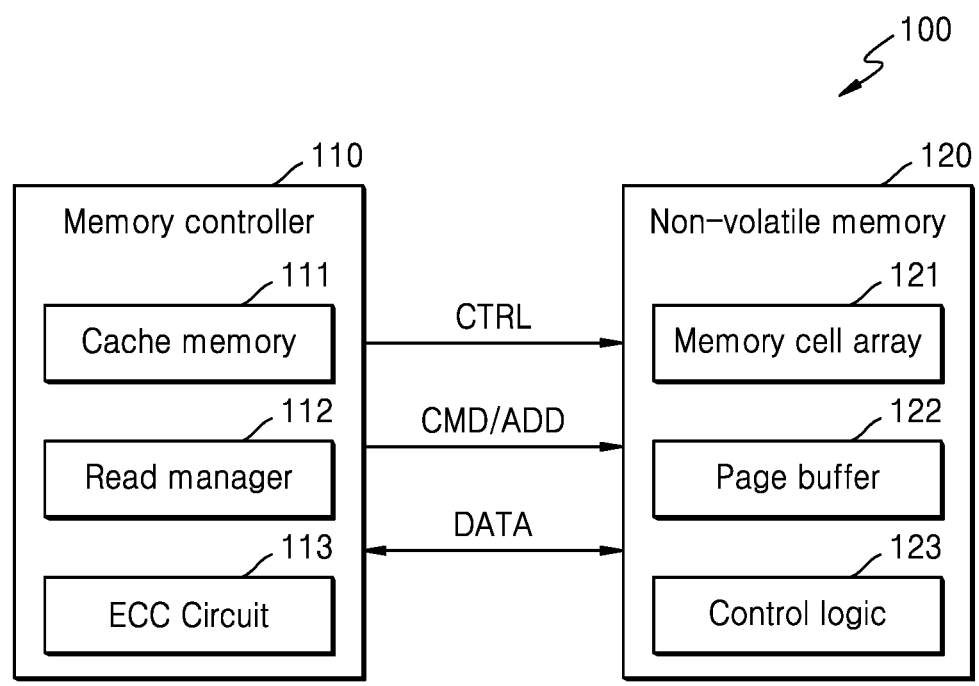
FIG. 1 is a diagram of a storage device according to an embodiment of the inventive concept.

FIG. 1 is a diagram of a storage device according to an embodiment;

Referring to FIG. 1, a storage device 100 may include a memory controller 110 and a non-volatile memory 120. The memory controller 110 and the non-volatile memory 120 may be integrated into a single semiconductor device. For example, the memory controller 110 and the non-volatile memory 120 may be integrated into a single semiconductor device, thereby forming a memory card. For example, the memory controller 110 and the non-volatile memory 120 may be integrated into a single semiconductor device, thereby forming a personal computer (PC) card, a compact flash card, a smart media card, a memory stick, a multimedia card, a secure digital (SD) card, universal flash storage (UFS), or the like. Alternatively, the memory controller 110 and the non-volatile memory 120 may be integrated into a single semiconductor device, thereby forming a solid-state drive (or a solid-state disk) (SSD).

The memory controller 110 may control the non-volatile memory 120 to read data (DATA) therefrom in response to a read request from a host or to write (or program) data (DATA) thereto in response to a write request from the host. For example, the memory controller 110 may provide a command CMD, an address ADD, and a control signal CTRL to the non-volatile memory 120 to control a write operation (or a program operation), a read operation, and an erase operation of the non-volatile memory 120. Data to be written (or write data) and read data may be exchanged between the memory controller 110 and the non-volatile memory 120.

The memory controller 110 may communicate with an external host via various standard interfaces. For example, the memory controller 110 may include an interface circuit, and the interface circuit may provide various standard interfaces between a host and the memory controller 110. Various standard interfaces may include an advanced technology attachment (ATA) interface, a serial-ATA (SATA) interface, an external SATA (e-SATA) interface, a small computer small interface (SCSI), a serial attached SCSI (SAS), a peripheral component interconnect (PCI) interface, a PCI express (PCI-E) interface, Institute of Electrical and Electronics Engineers (IEEE) 1394, a universal serial bus (USB) interface, an SD card interface, a multimedia card (MMC) interface, an embedded MMC (eMMC) interface, a UFS interface, and a compact flash (CF) card interface.

The memory controller 110 may include a cache memory 111, a read manager 112, and an error correction code (ECC) circuit 113.

The cache memory 111 may temporarily store data. When the storage device 100 is booted, metadata stored in the non-volatile memory 120 may be loaded to the cache memory 111. The cache memory 111 may include volatile memory, such as static random access memory (SRAM) or dynamic RAM (DRAM).

In an embodiment, the cache memory 111 may store at least one weight table, at least one offset table, and a displacement level. A weight table, an offset table, and a displacement level may be used to calculate a read voltage for a read pass. In other words, to determine the read voltage for a read pass, a weight table, an offset table, and a displacement level may be employed.

The read pass may refer to a read operation result corresponding to the case where read data does not include an error (or is normal). Alternatively, the read pass may refer to a read operation result corresponding to the case where read data includes an error correctable by the ECC circuit 113. A read fail may refer to a read operation result corresponding to the case where read data includes an error uncorrectable by the ECC circuit 113.

A weight table may include weights preset according to word line groups and read voltages. In other words, the weight table may contain preset weights. A word line group may include at least some of a plurality of word lines included in the non-volatile memory 120. A read voltage may be applied to a word line to read data from programmed memory cells. An offset table may include offset levels preset according to word line groups and read voltages. In other words, the offset table may contain preset offset levels.

A displacement level may be a value corresponding to a difference between a default read voltage level in a default read voltage set and an optimal read voltage level in an optimal read voltage set. In other words, the displacement level may represent the difference between the default read voltage level in the default set and the optimal read voltage level in the optimal set. The displacement level may be calculated by a recovery code executed by the memory controller 110. The displacement level may be updated when a read operation is completed. The displacement level may be set and stored for each memory block. The default read voltage set may include a read voltage not reflecting a degradation degree of a memory cell or a degradation degree of a memory block including memory cells. One default read voltage set may be configured for the non-volatile memory 120 or one chip, but embodiments are not limited thereto. A read voltage included in the default read voltage set may be referred to as a default read voltage, and the kind of default read voltage may vary with the kind of memory cell. The optimal read voltage set may include a read voltage corresponding to an intersection between different threshold voltage distributions of memory cells. The optimal read voltage set may also include a read voltage obtained as a result of executing a recovery code. A read voltage included in the optimal read voltage set may be referred to as an optimal read voltage and the kind of optimal read voltage may vary with the kind of memory cell. The optimal read voltage set may vary with a retention time.

Alternatively, the cache memory 111 may store a plurality of weight tables, a plurality of offset tables, and a degradation parameter table. The degradation parameter table may have a data structure including degradation parameter values for respective memory blocks. In other words, the degradation parameter table may have a structure that holds degradation parameter values for each memory block.

The cache memory 111 may store a recovery code or a plurality of recovery codes.

The read manager 112 may control the non-volatile memory 120 to read data therefrom in response to a read request from a host. For example, in response to a read request, the read manager 112 may provide a command CMD instructing to read data and an address ADD to the non-volatile memory 120. At this time, the command CMD instructing to read data may be referred to as a read command.

The read manager 112 may manage or adjust read voltages. For example, when read data is not corrected by the ECC circuit 113, the read manager 112 may adjust a read voltage used by the non-volatile memory 120. An adjusted read voltage may be included in a control signal CTRL. For example, when read data is not corrected by the ECC circuit 113, the read manager 112 may calculate a degradation compensation level based on at least one weight table, at least one offset table, and a displacement level, which are stored in the cache memory 111. In other words, when read data is not corrected by ECC circuit 113, the read manager 112 calculates a degradation compensation level using at least one weight table, at least one offset table, and a displacement level stored in the cache memory 111. Here, the degradation compensation level may correspond to a compensation value for calibrating a read voltage according to a change in the threshold voltage distribution of memory cells due to degradation. The read manager 112 may calculate a history read voltage set by performing an operation on a default read voltage set and a degradation compensation level. A history read voltage may correspond to a result of performing an operation on a default read voltage and a degradation compensation level.

The read manager 112 may control the non-volatile memory 120 to read data based on a managed read voltage or an adjusted read voltage. For example, the managed or adjusted read voltage may include a default read voltage set, a history read voltage set, or an optimal read voltage set. In an embodiment, the read manager 112 may use a default read voltage set in response to a read request. When data read using the default read voltage set is not corrected by the ECC circuit 113, the read manager 112 may use the history read voltage set. When data read using the history read voltage set is not corrected by the ECC circuit 113, the read manager 112 may use the optimal read voltage set. A read voltage set used herein may refer to a default read voltage set, an optimal read voltage set, or a history read voltage set.

The ECC circuit 113 may detect and correct an error in data read by the non-volatile memory 120. For example, the ECC circuit 113 may generate an ECC with respect to data to be written to the non-volatile memory 120. The ECC may be stored in the non-volatile memory 120 together with the data. The ECC circuit 113 may detect and correct an error in data read by the non-volatile memory 120, based on the ECC stored in the non-volatile memory 120. For example, the ECC circuit 113 may have a certain error correction capability. Data including error bits (or fail bits) exceeding the error correction capability of the ECC circuit 113 may be referred to as uncorrectable ECC (UECC) data. In an embodiment, UECC data may occur when a read operation performed using a default read voltage set, a history read voltage set, or an optimal read voltage set fails. When read data is UECC data, the read manager 112 may adjust at least one read voltage used for the read operation and control the non-volatile memory 120 to newly perform a read operation using an adjusted read voltage.

The non-volatile memory 120 may correspond to a flash memory device including flash memory cells. However, embodiments are not limited thereto. Hereinafter, it is assumed that the non-volatile memory 120 is a flash memory device. A flash memory cell may be referred to as a memory cell.

The non-volatile memory 120 may include a memory cell array 121. The memory cell array 121 may include a plurality of memory blocks. Each memory block may include a plurality of memory cells respectively in regions, in which a plurality of word lines intersect with a plurality of bit lines. The memory cells may have a plurality of threshold voltage distributions according to programmed data. For example, when each of the memory cells is a single-level cell (SLC) storing a single bit, the memory cells may have two threshold voltage distributions according to program states. Alternatively, when each of the memory cells is a multi-level cell (MLC) storing two bits, the memory cells may have four threshold voltage distributions according to program states. As an alternative, when each of the memory cells is a triple-level cell (TLC) storing three bits, the memory cells may have eight threshold voltage distributions according to program states. When each of the memory cells stores at least four bits, the memory cells may have at least sixteen threshold voltage distributions according to program states.

The non-volatile memory 120 may include a page buffer 122. The page buffer 122 may operate as a sense amplifier in a read operation. In other words, the page buffer 122 may sense data stored in the memory cell array 121.

The non-volatile memory 120 may include a control logic 123. The control logic 123 may control the page buffer 122 to sense data.

According to the embodiment described above, a read pass probability may be increased by appropriately adjusting a read voltage according to the degradation degree of a memory cell, and accordingly, the performance and reliability of the storage device 100 may increase.

Figure 2:
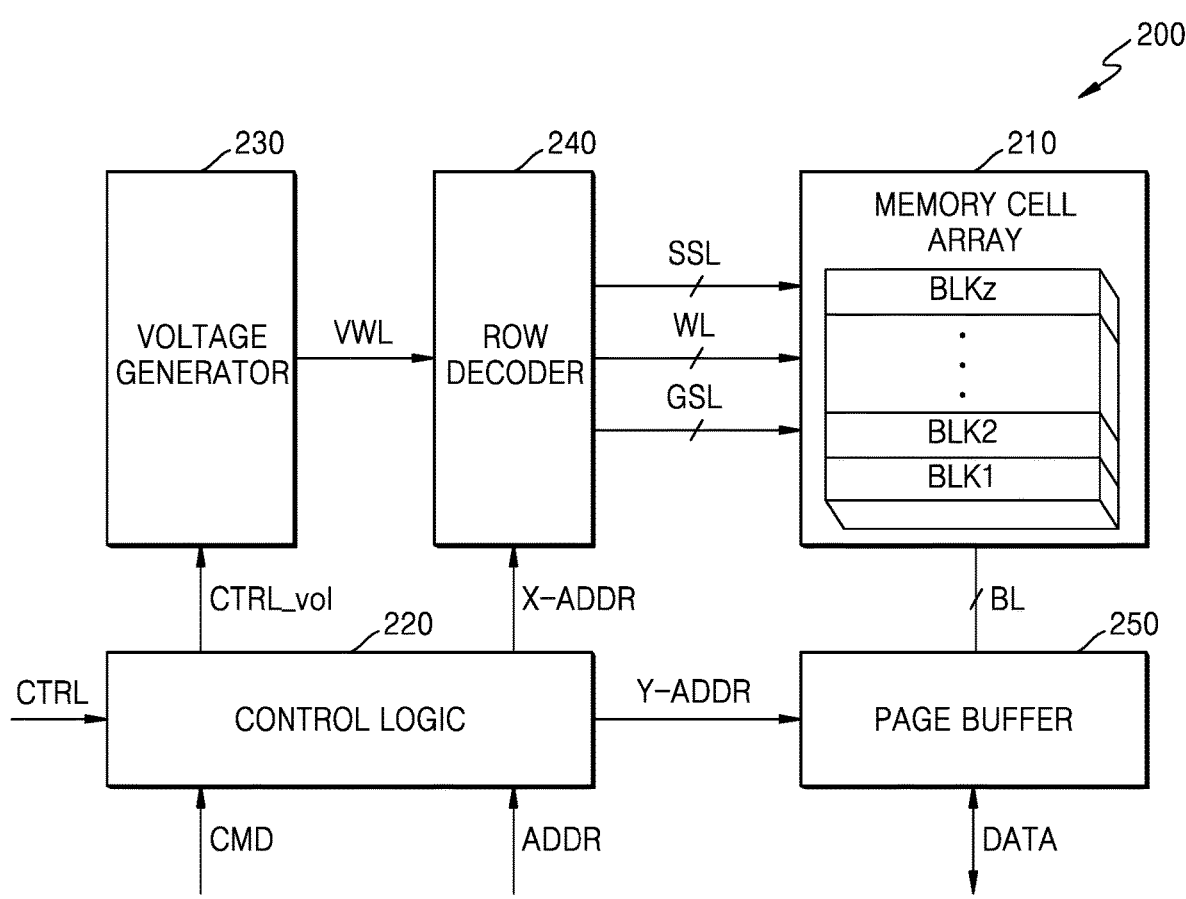
FIG. 2 is a diagram of a non-volatile memory according to an embodiment of the inventive concept.

FIG. 2 is a diagram of a non-volatile memory according to an embodiment.

Referring to FIG. 2, a non-volatile memory 200 may include a memory cell array 210, a control logic 220, a voltage generator 230, a row decoder 240, and a page buffer 250. In some embodiments, the non-volatile memory 200 may further include a data input/output (I/O) circuit or an I/O interface.

The memory cell array 210 may include a plurality of memory cells and may be connected to word lines WL, string selection lines SSL, ground selection lines GSL, and bit lines BL. For example, the memory cell array 210 may be connected to the row decoder 240 through the word lines WL, the string selection lines SSL, and the ground selection lines GSL and connected to the page buffer 250 through the bit lines BL.

The memory cell array 210 may include a plurality of blocks BLK1 to BLKz. For example, each of the blocks BLK1 to BLKz may have a three-dimensional (3D) structure (or a vertical structure). Each block may include structures extending in first to third directions. For example, each block may include a plurality of NAND strings (hereinafter, referred to as "strings") extending in the third direction. In this case, the strings may be separated from one another by a certain distance in the first and second directions. The blocks BLK1 to BLKz may be selected by the row decoder 240. For example, the row decoder 240 may select a block corresponding to a block address among the blocks BLK1 to BLKz.

Each of the memory cells of the memory cell array 210 may store at least one bit. For example, a memory cell may be an SLC storing one bit of data. Alternatively, a memory cell may be an MLC storing two bits of data. As an alternative, a memory cell may be a TLC storing three bits of data. Alternatively, a memory cell may be a quad-level cell or a quadruple-level cell (QLC) storing four bits of data. However, the inventive concept is not limited thereto.

The blocks BLK1 to BLKz may include at least one selected from the group consisting of an SLC block including SLCs, an MLC block including MLCs, a TLC block including TLCs, and a QLC block including QLCs. Some blocks of the memory cell array 210 may be SLC blocks, and other blocks of the memory cell array 210 may be MLC or TLC blocks.

An erase voltage is applied to the memory cell array 210, and as a result, memory cells may be in an erase state. When a program voltage is applied to the memory cell array 210, memory cells may be in a program state. At this time, each memory cell may be in an erase state and at least one program state, which are distinguished from each other by a threshold voltage.

The control logic 220 may control various operations of the non-volatile memory 200. For example, the control logic 220 may output various control signals for writing data (DATA) to or reading data (DATA) from the memory cell array 210, based on the command CMD, the address ADDR, and the control signal CTRL.

The various control signals output from the control logic 220 may be provided to the voltage generator 230, the row decoder 240, and the page buffer 250. The control logic 220 may provide a voltage control signal CTRL_vol to the voltage generator 230.

The control logic 220 may further include a cell counter. The cell counter may count the number of memory cells in a particular threshold voltage range from data sensed by the page buffer 250. A counted cell may be referred to as an off-cell.

The voltage generator 230 may be connected to the memory cell array 210 through the word lines WL. The voltage generator 230 may generate various kinds of voltages for performing program, read, and erase operations of the memory cell array 210, based on the voltage control signal CTRL_vol. The voltage generator 230 may generate a word line voltage VWL, such as a program voltage, a verify voltage, a read voltage, or an erase voltage.

The program voltage, the verify voltage, the read voltage, or the erase voltage generated by the voltage generator 230 may be provided to a selected word line among the word lines WL. The selected word line may include at least one word line selected by a row address X-ADDR.

The row decoder 240 may select a particular word line among the word lines WL in response to the row address X-ADDR received from the control logic 220. For example, in a program operation, the row decoder 240 may provide a program voltage to the selected word line. The row decoder 240 may also select some of the string selection lines SSL or some of the ground selection lines GSL in response to the row address X-ADDR received from the control logic 220. In a read operation, the row decoder 240 may apply a read voltage to the selected word line and a read pass voltage to an unselected word line.

The page buffer 250 may be connected to the memory cell array 210 through the bit lines BL. The page buffer 250 may select some of the bit lines BL in response to a column address Y-ADDR received from the control logic 220. In a verify operation or a read operation, the page buffer 250 may operate as a sense amplifier and sense data stored in a selected memory cell through a selected bit line. In a program operation, the page buffer 250 may operate as a write driver and input data to be written into the memory cell array 210. The page buffer 250 may include a plurality of page buffers. In this case, each page buffer may be connected to at least one bit line.

The page buffer 250 may store data (DATA) read from the memory cell array 210 or data (DATA) to be written to the memory cell array 210.

The page buffer 250 may include a plurality of page buffers respectively connected to the bit lines BL. The page buffers may be arranged in correspondence to the bit lines BL, respectively, and each page buffer may include a plurality of latches. Hereinafter, the page buffer 250 is referred to as including page buffers respectively connected to the bit lines BL. However, terms may be use differently in different embodiments. For example, a single page buffer may be provided in correspondence to a plurality of bit lines, and a unit of a configuration arranged in correspondence to each bit line may be referred to as a page buffer unit.

Figure 3:
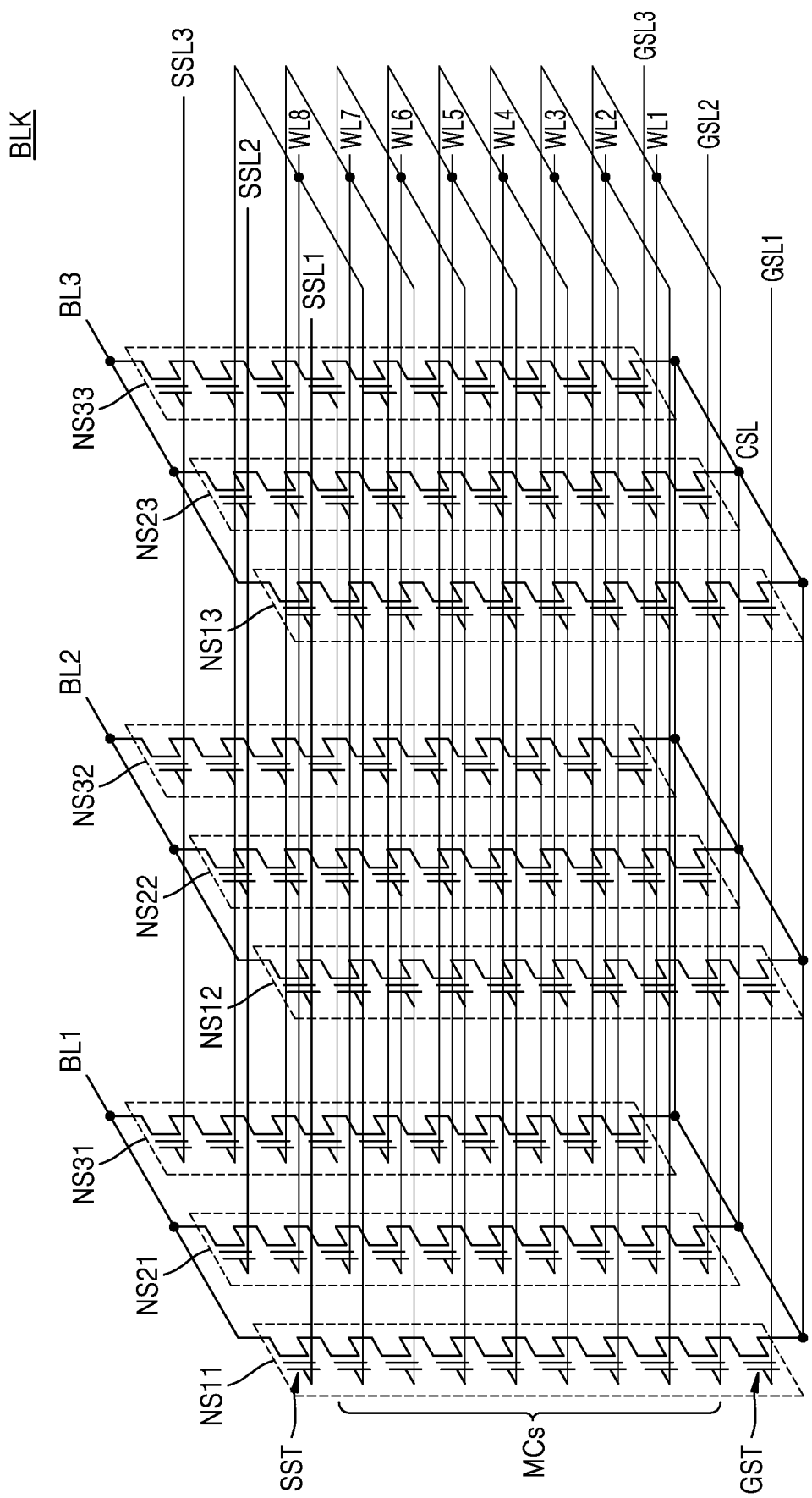
FIG. 3 is a circuit diagram of a memory block according to an embodiment of the inventive concept.

FIG. 3 is a circuit diagram of a memory block according to an embodiment.

Referring to FIG. 3, a memory block BLK may include NAND strings NS11, NS21, NS31, NS12, NS22, NS32, NS13, NS23 and NS33. Each NAND string (e.g., NS11) may include a string selection transistor SST, a plurality of memory cells MCs, and a ground selection transistor GST, which are connected in series to one another. The transistors, e.g., the string selection transistor SST and the ground selection transistor GST, and the memory cells MCs included in each NAND string may form a stack structure on a substrate in a vertical direction.

First to third bit lines BL1, BL2 and BL3 may extend in a first direction, and word lines WL1, WL2, WL3, WL4, WL5, WL6, WL7 and WL8 may extend in a second direction. The NAND strings NS11, NS21, and NS31 may be between the first bit line BL1 and a common source line CSL, the NAND strings NS12, NS22, and NS32 may be between the second bit line BL2 and the common source line CSL, and the NAND strings NS13, NS23, and NS33 may be between the third bit line BL3 and the common source line CSL.

The string selection transistor SST may be connected to its corresponding string selection line among string selection lines SSL1, SSL2 and SSL3. Each of the memory cells MCs may be connected to its corresponding word line among the word lines WL1 to WL8. The ground selection transistor GST may be connected to its corresponding ground selection line among ground selection lines GSL1, GSL2 and GSL3. The string selection transistor SST may be connected to its corresponding bit line among the first to third bit lines BL1 to BL3, and the ground selection transistor GST may be connected to the common source line CSL. Here, the numbers of NAND strings, word lines, bit lines, ground selection lines, and string selection lines may vary with embodiments.

Figure 4:
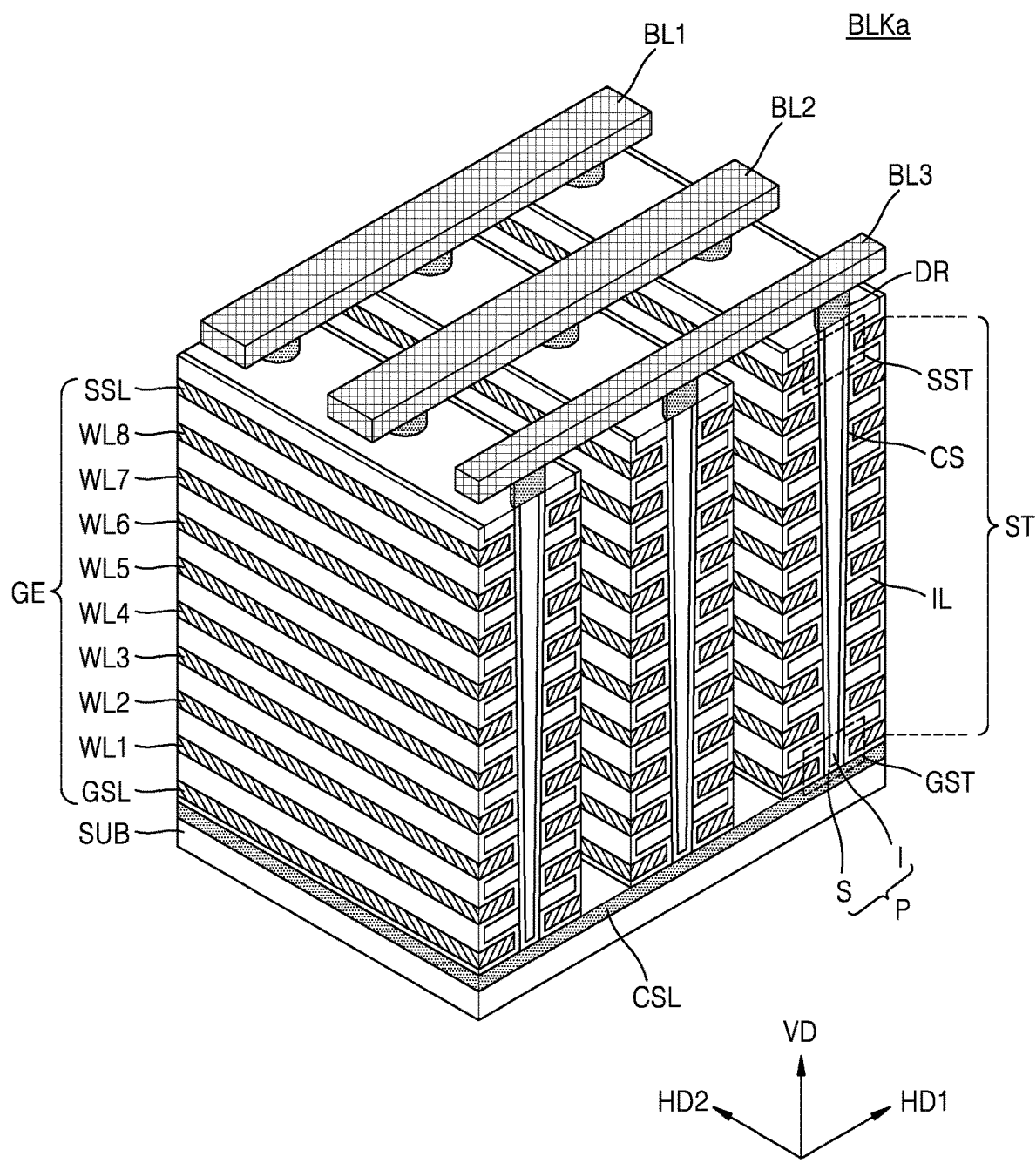
FIG. 4 is a perspective view of a memory block according to an embodiment of the inventive concept.

FIG. 4 is a perspective view of a memory block according to an embodiment.

Referring to FIG. 4, a memory block BLKa may include a memory stack ST extending on a substrate SUB in a vertical direction VD. For example, the memory block BLKa may include a single memory stack ST between the substrate SUB and the first to third bit lines BL1 to BL3. Common source lines CSL may be on the substrate SUB. In a region of the substrate SUB between two adjacent common source lines CSL, insulating layers IL may extend in a second horizontal direction HD2 and may be sequentially provided in the vertical direction VD. The insulating layers IL may be separated from each other by a certain distance in the vertical direction VD. In the region of the substrate SUB between two adjacent common source lines CSL, pillars P may pass through the insulating layers IL in the vertical direction VD. The pillars P may be referred to as channel holes. The pillars P may have a cup shape (or a cylindrical shape with a closed bottom), which extends in the vertical direction VD. A surface layer S of each pillar P may include a silicon material of a first conductivity type and may function as a channel region. An inner layer I of each pillar P may include an insulating material such as silicon oxide or an air gap.

In the region between two adjacent common source lines CSL, a charge storage layer CS may be provided along the exposed surfaces of the insulating layers IL, the pillars P, and the substrate SUB. The charge storage layer CS may include a gate insulating layer, a charge trap layer, and a blocking insulating layer. For example, the charge storage layer CS may have an oxide-nitride-oxide (ONO) structure. In the region between two adjacent common source lines CSL, gate electrodes GE, such as a ground selection line GSL, a string selection line SSL, and the word lines WL1 to WL8, may be provided on an exposed surface of the charge storage layer CS. Drains DR may be respectively provided on the pillars P. The first to third bit lines BL1 to BL3 may extend on the drains DR in a first horizontal direction HD1 and may be separated from each other by a certain distance in the second horizontal direction HD2.

Figure 5:
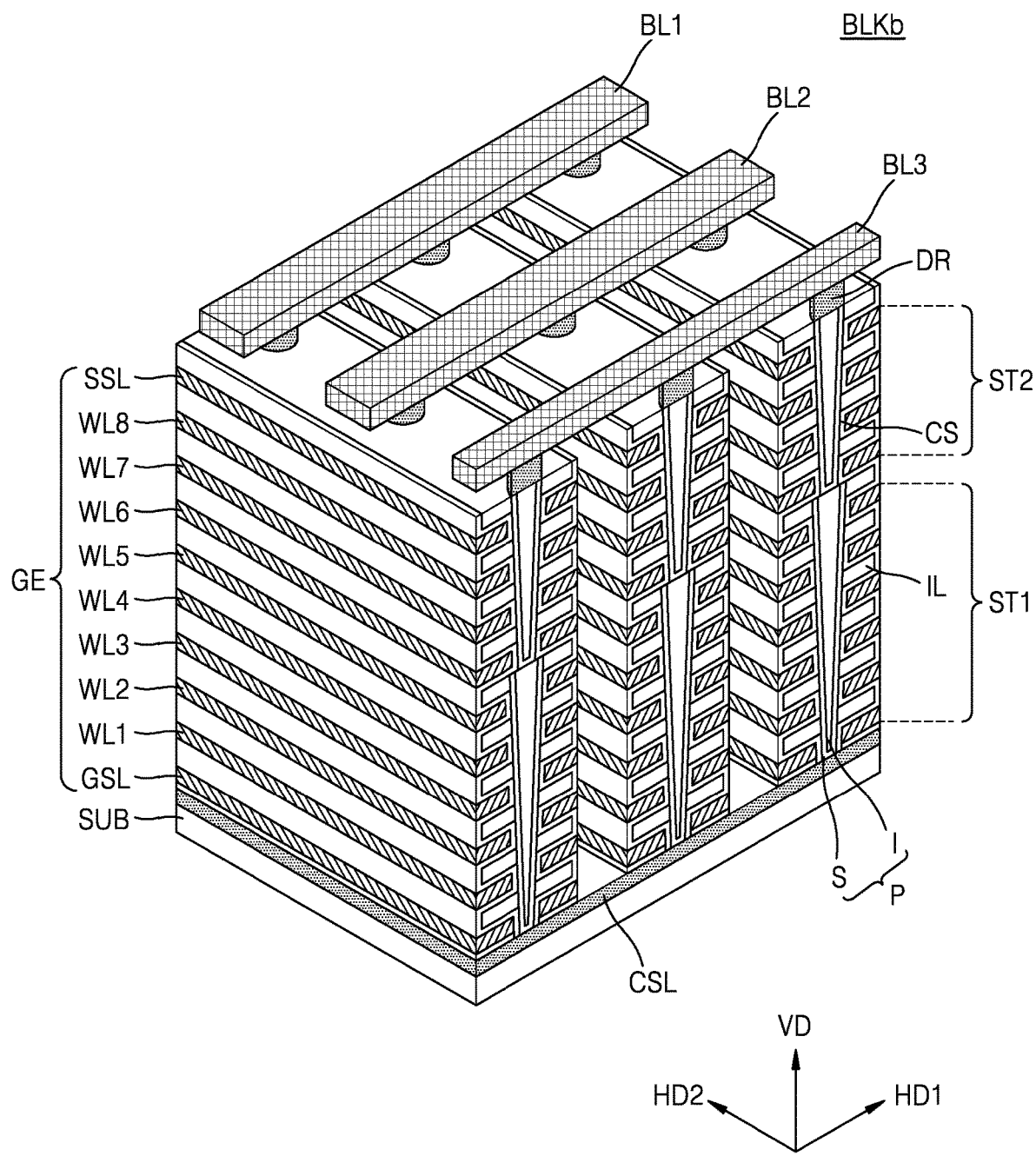
FIG. 5 is a perspective view of a memory block according to some embodiments of the inventive concept.

FIG. 5 is a perspective view of a memory block according to some embodiments.

Referring to FIG. 5, a memory block BLKb may correspond to a modification of the memory block BLKa of FIG. 4, and the descriptions given above with reference to FIG. 4 may also applied to the present embodiment. The memory block BLKb may include a first memory stack ST1 and a second memory stack ST2, which are stacked on the substrate SUB in the vertical direction VD. For example, the memory block BLKb may include two memory stacks, i.e., the first and second memory stacks ST1 and ST2, between the substrate SUB and the first to third bit lines BL1 to BL3 and thus have a multi-stack structure, e.g., a two-stack structure. However, the inventive concept is not limited thereto. According to embodiments, a memory block may include at least three memory stacks between the substrate SUB and the first to third bit lines BL1 to BL3.

For manufacturing reasons, the size of the pillars P in FIG. 4 or 5 (or the size of channel holes or a channel length) may vary with the position of a word line. For example, the size of a pillar may decrease toward a bottom word line in a stack. As the size of a pillar decreases, degradation of a word line may increase. Accordingly, degradation of a lower word line may be greater than degradation of an upper word line. Accordingly, a weight and an offset, which are used for read voltage compensation, may be differently set according to the position of a word line. In other words, the degradation of a lower word line may exceed that of an upper word line, necessitating varying weight and offset values for read voltage compensation according to the position of the word line.

Figure 6:
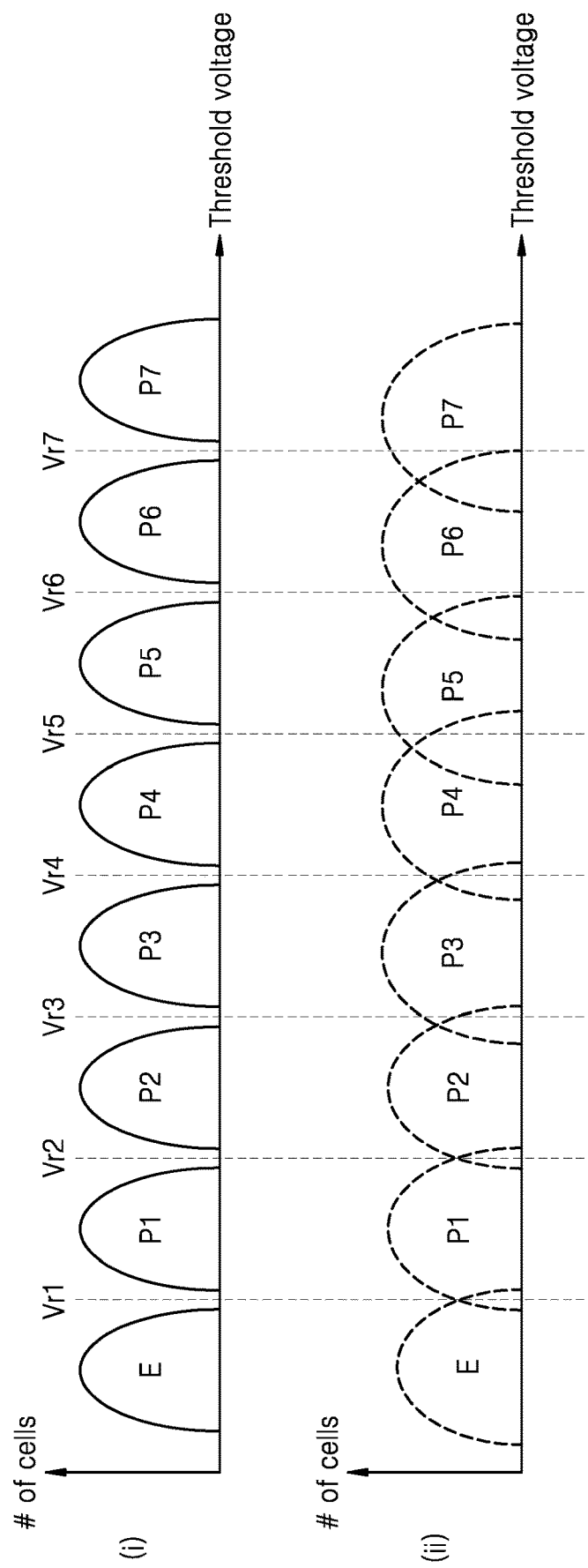
FIG. 6 is a diagram illustrating changes in threshold voltage distributions with respect to degradation of memory cells included in non-volatile memory.

FIG. 6 is a diagram illustrating changes in threshold voltage distributions with respect to degradation of memory cells included in non-volatile memory.

Hereinafter, for convenience of description, memory cells included in the non-volatile memory 120 are assumed to be TLCs. Because the memory cells are TLCs, a read voltage set may include seven different read voltages. However, the inventive concept is not limited thereto.

In the graph of FIG. 6, the horizontal axis is a threshold voltage, and the vertical axis is the number of memory cells (i.e., # of cells). Each of the memory cells of the non-volatile memory 120 may be in one of an erase state E and first to seventh program states P1, P2, P3, P4, P5, P6 and P7. After the memory cells are programmed, the memory cells may have threshold voltage distributions, as shown in (i) of FIG. 6. The non-volatile memory 120 may read data by determining the states of memory cells, based on a plurality of read voltages, e.g., first to seventh read voltages Vr1, Vr2, Vr3, Vr4, Vr5, Vr6 and Vr7.

However, the threshold voltage of memory cells may be changed by various factors. For example, one of the various factors may be a retention time that is the time elapsed since the completion of programming. When a retention time elapses, the amount of charges trapped in memory cells may decrease, and the threshold voltage distribution of the memory cells may change or shift. In detail, with the elapse of a retention time, charges stored in a charge storage layer of a memory cell may leak into a substrate, and accordingly, the threshold voltage of memory cells may be decreased and changed, as shown in (ii) of FIG. 6.

Referring to (ii) of FIG. 6, data read based on the first to seventh read voltages Vr1 to Vr7 may include an error. The memory controller 110 may detect an error in the read data. When a variance in the threshold voltage distribution of memory cells is greater than a certain level, errors exceeding the error correction capability of the memory controller 110 (e.g., the ECC circuit 113) may be included in data.

The change and shift of a threshold voltage distribution may be influenced by repetition of a program operation and/or an erase operation (e.g., a program and erase (P/E) cycle), interference of adjacent cells, and/or the like as well as a retention time. For example, when the P/E cycle of a first memory block is different from that of a second memory block even though the retention time of the first memory block is the same as that of the second memory block, the change pattern of a threshold voltage distribution corresponding to the first memory block may be different from that of a threshold voltage distribution corresponding to the second memory block.

In some embodiments, when memory cells are QLCs, each of the memory cells may be in one of the erase state E and fifteen program states, and a read voltage set may include fifteen different read voltages. In this case, the threshold voltage distribution of memory cells may also change or shift with the elapse of a retention time, and data read based on the read voltages may include an error.

Hereinafter, a method of finding an optimal read voltage according to a change in a threshold voltage distribution is described with respect to the sixth and seventh program states P6 and P7.

Figure 7:
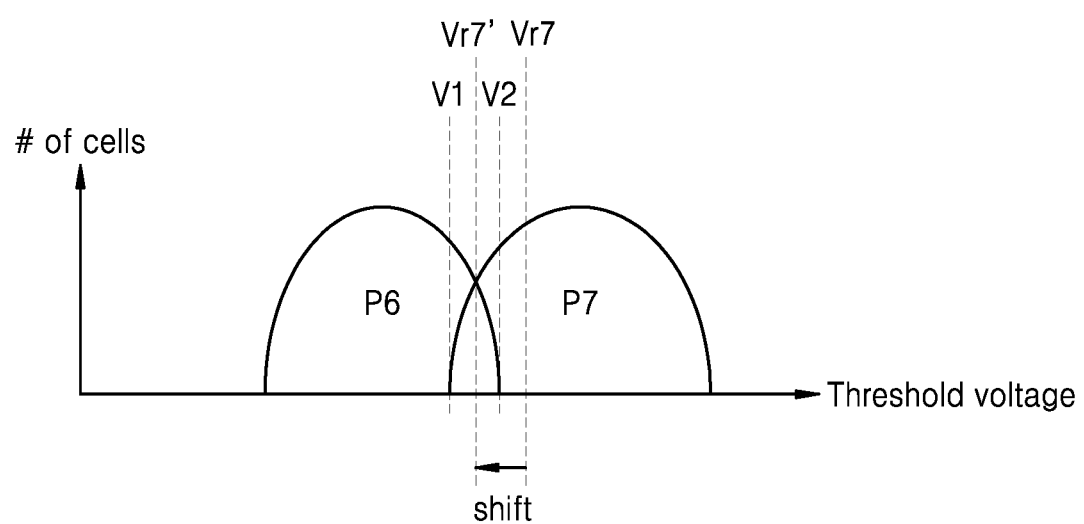
FIG. 7 is a diagram illustrating changes in threshold voltage distributions respectively corresponding to sixth and seventh program states in FIG. 6.

FIG. 7 is a diagram illustrating changes in threshold voltage distributions respectively corresponding to the sixth and seventh program states P6 and P7 in FIG. 6

Referring to FIG. 7, the threshold voltage distribution corresponding to the sixth program state P6 and the threshold voltage distribution corresponding to the seventh program state P7 may change because of the elapse of a retention time or the like. In this case, data read based on the seventh read voltage Vr7 may include an uncorrectable error.

The memory controller 110 may execute a recovery code by firmware. For example, the recovery code may include a read retry. The read retry may refer to an operation of finding an optimal read voltage and newly performing a read operation based on the optimal read voltage. At this time, a valley may be formed in the intersection between the threshold voltage distribution of memory cells in the sixth program state P6 and the threshold voltage distribution of memory cells in the seventh program state P7. When a read operation is performed using, as the optimal read voltage, a read voltage Vr7' having a level corresponding to the valley, the error of the read operation may be decreased. An operation of finding the valley may be performed to find the optimal read voltage, as described above, and this operation may be referred to as a valley search. In other words, the valley search may be used to determine the optimal read voltage.

The valley search may be carried out by sensing a bit line using levels around a level estimated as a valley, counting the number of memory cells based on sensing results, and finding the valley by using the number of memory cells. For example, the non-volatile memory 120 may sense a bit line by using a first voltage V1 and a second voltage V2, count memory cells having a threshold voltage between the first voltage V1 and the second voltage V2, identify a valley according to a result of the counting, and find the read voltage Vr7' having the level corresponding to the valley.

The seventh read voltage Vr7 may be included in a default read voltage set, and the read voltage Vr7' may be included in an optimal read voltage set. The read voltage Vr7' may be shifted from the seventh read voltage Vr7 by a certain level. At this time, a shift level corresponding to the certain level may correspond to the displacement level described above. The displacement level may refer to a value corresponding to the shift from a default read voltage (e.g., the seventh read voltage Vr7) to a newly found optimal read voltage (e.g., the read voltage Vr7'). In other words, the displacement level corresponds to a difference between the default read voltage and the optimal read voltage.

According to the description above, when a read operation is performed based on the read voltage Vr7' having the level corresponding to the valley, a read pass probability may increase.

Figure 8:
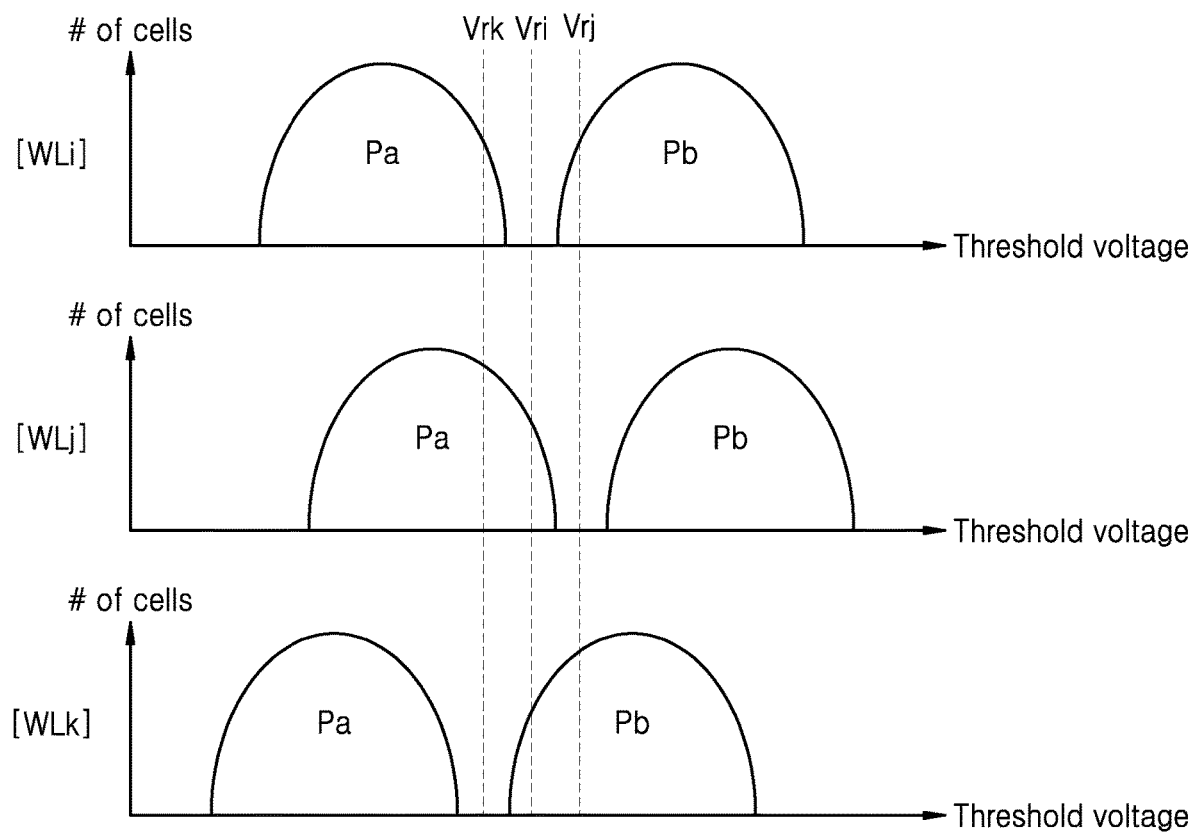
FIG. 8 is a diagram illustrating changes in threshold voltage distributions in respective word lines.

FIG. 8 is a diagram illustrating changes in threshold voltage distributions in respective word lines.

Hereinafter, it is assumed that memory cells are TLCs and FIG. 8 illustrates threshold voltage distributions respectively corresponding to only two program states Pa and Pb.

FIG. 8 illustrates threshold voltage distributions of memory cells connected to an i-th word line WLi, threshold voltage distributions of memory cells connected to a j-th word line WLj, and threshold voltage distributions of memory cells connected to a k-th word line WLk. Here, each of "i", "j", and "k" may be a natural number.

With respect to the memory cells connected to the i-th word line WLi, two program states Pa and Pb may be identified by a read voltage Vri. With respect to the memory cells connected to the j-th word line WLj, two program states Pa and Pb may be identified by a read voltage Vrj. With respect to the memory cells connected to the k-th word line WLk, two program states Pa and Pb may be identified by a read voltage Vrk.

As can be seen, a read voltage for identifying the program states of memory cells connected to a particular word line may not be used to identify the program states of memory cells connected to another word line. For example, the program states Pa and Pb of the memory cells connected to the k-th word line WLk may not be identified by the read voltage Vrj.

A threshold voltage distribution may vary with the positions of memory cells. For example, in a process of forming a string, the cross-section area of the pillar P parallel with the top surface of the substrate SUB may decrease toward the substrate SUB, considering the width of the pillar P. Accordingly, when a voltage is applied to a memory cell near the substrate SUB through a word line, an electric field formed in the memory cell near the substrate SUB may be greater than an electric field formed in a memory cell far from the substrate SUB. This may influence read disturbance and cause a different degradation status in each word line. In addition, a degradation degree may vary with the position of a memory cell because of various factors such as a retention time, a P/E cycle, and temperature. Because memory cells connected to the same word line have substantially the same distance to a substrate and the width of a pillar near the memory cells are substantially constant, the memory cells may have similar degradation status to each other.

As described above, the read voltage Vri, Vrj, or Vrk for identifying the program states Pa and Pb may vary with the position of a word line, a level by which a read voltage is shifted with the occurrence of degradation may vary with the position of a word line, and an optimal read voltage to be searched for with the occurrence of degradation may vary with the position of a word line.

An optimal read voltage for a word line with respect to a retention time is described below.

Figure 9:
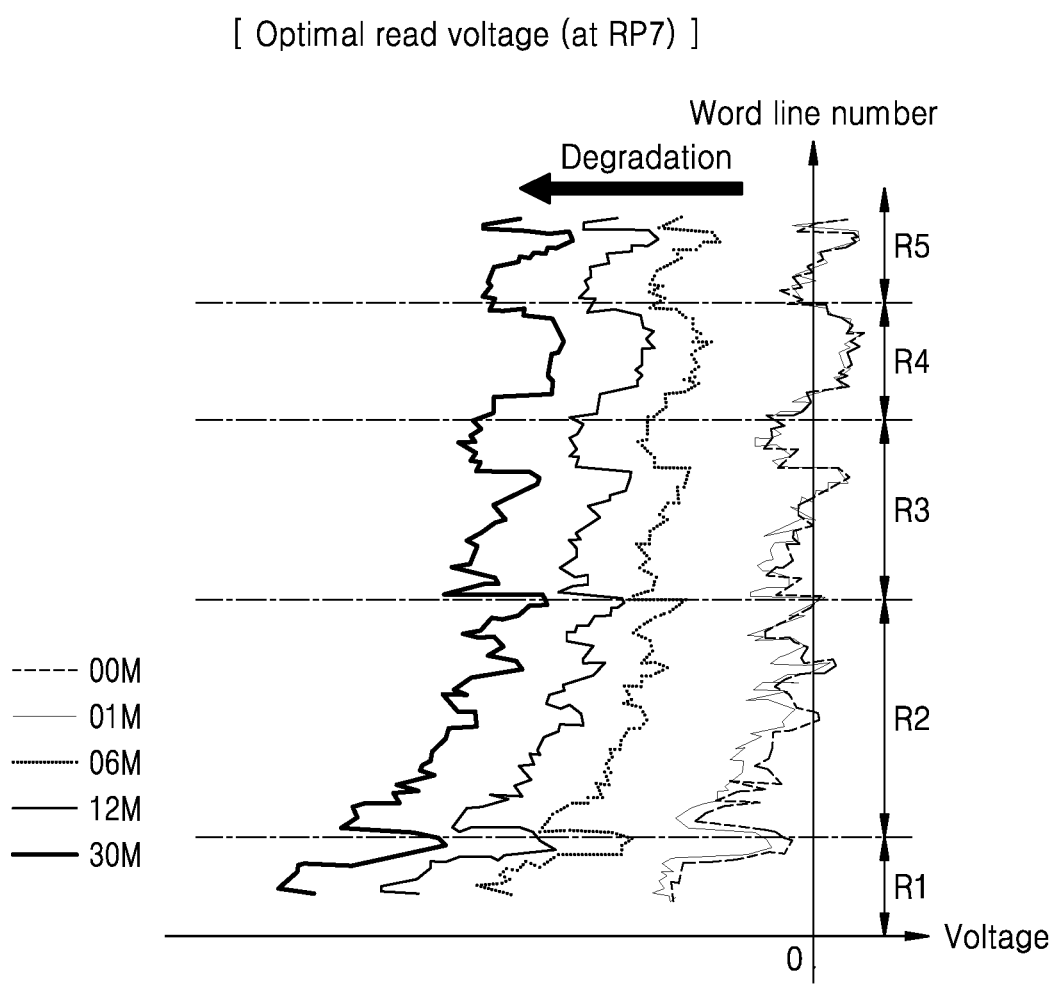
FIG. 9 is a graph showing an optimal read voltage for a word line with respect to a retention time.

FIG. 9 is a graph showing an optimal read voltage for a word line with respect to a retention time. For example, FIG. 9 shows the change in a state read voltage RP7 for identifying the sixth and seventh program states P6 and P7, and optimal read voltages for identifying other program states may show a similar tendency to that shown in FIG. 9.

In the graph of FIG. 9, the horizontal axis is an optimal read voltage, and the vertical axis is a word line number. In the graph, "00M", "01M", "06M", "12M", and 30M" indicate that a retention time elapses less than one month, one month, six months, 12 months, and 30 months, respectively, since the programming of memory cells. However, the retention time is not limited thereto. As the retention time increases, a degradation degree increases, and accordingly, an optimal read voltage tends to decrease (e.g., in a negative direction) to a value less than 0, as shown in FIG. 9.

In an embodiment, the word line number allocated to each word line increases away from the substrate SUB. Based on a certain retention time, as the position of a word line is closer to the substrate SUB, in other words, the word line number decreases, a degradation degree increases, and accordingly, an optimal read voltage tends to decrease but the magnitude of the optimal read voltage tends to increase. For example, word lines in a first region R1 among first to fifth regions R1, R2, R3, R4 and R5 may be lower word lines relatively close to the substrate SUB, and word lines in the fifth region R5 may be upper word lines farthest from the substrate SUB. In this case, the degradation degree of a memory cell connected to a word line in the first region R1 may be greater than the degradation degree of a memory cell connected to a word line in the fifth region R5. Although there are five regions in the graph of FIG. 9, embodiments are not limited thereto.

Figure 10:
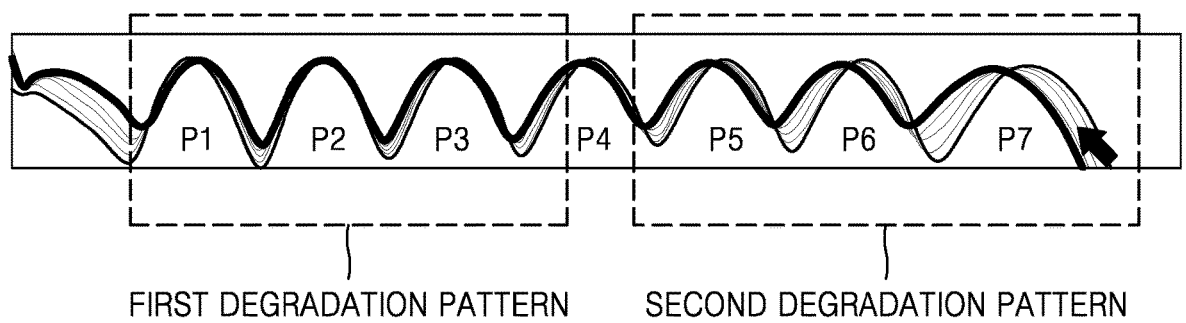
FIG. 10 is a diagram illustrating degradation patterns with respect to program states of memory cells.

FIG. 10 is a diagram illustrating degradation patterns with respect to program states of memory cells.

Referring to FIGS. 6 and 10, memory cells are assumed to be TLCs. As a retention time elapses, the threshold voltage distributions respectively corresponding to the first to seventh program states P1 to P7 may shift toward the erase state E (or the left of FIG. 10), as shown by the arrow in FIG. 10.

In an embodiment, at least some program states among the first to seventh program states P1 to P7 may have a similar degradation pattern to each other. For example, the first to third program states P1 to P3 may have a first degradation pattern, and the fifth to seventh program states P5 to P7 may have a second degradation pattern. The first degradation pattern may show less degradation status than the second degradation pattern. For example, memory cells in the first to third program states P1 to P3 may be less degraded than memory cells in the fifth to seventh program states P5 to P7.

In an embodiment, the degradation degree of memory cells in a higher program state may be greater than the degradation degree of memory cells in a lower program state. For example, the degradation degree of memory cells in the seventh program state P7 may be greater than the degradation degree of memory cells in the sixth program state P6. The degradation degree of memory cells in the fourth program state P4 may be greater than the degradation degree of memory cells in the third program state P3.

Because the degradation degree of memory cells in a lower program state may be less than the degradation degree of memory cells in a higher program state, a degradation compensation level for compensation of a read voltage (e.g., a default read voltage) may be differently calculated according to a program state. In other words, since memory cells in a lower program state may experience less degradation than those in a higher program state, the degradation compensation level for adjusting the read voltage (such as the default read voltage) may be calculated differently based on the program state. In an embodiment, a default read voltage set may include first to n-th default read voltages, where "n" is a natural number of at least 2. For example, the first to n-th default read voltages may be respectively the first to seventh read voltages Vr1 to Vr7 in FIG. 6. A degradation compensation level corresponding to an i-th default read voltage ("i" is an integer that is at least 1 and at most n−1) may be less than a degradation compensation level corresponding to a j-th default read voltage ("j" is an integer that is greater than "i" and less than or equal to "n").

In some embodiments, when memory cells are QLCs, at least some of fifteen program states may have a similar degradation pattern to each other. Fifteen program states may be classified into at least two degradation patterns. The degradation degree of memory cells in a higher program state may be greater than the degradation degree of memory cells in a lower program state, and a degradation compensation level for read voltage compensation may be differently calculated according to a program state.

Figure 11:
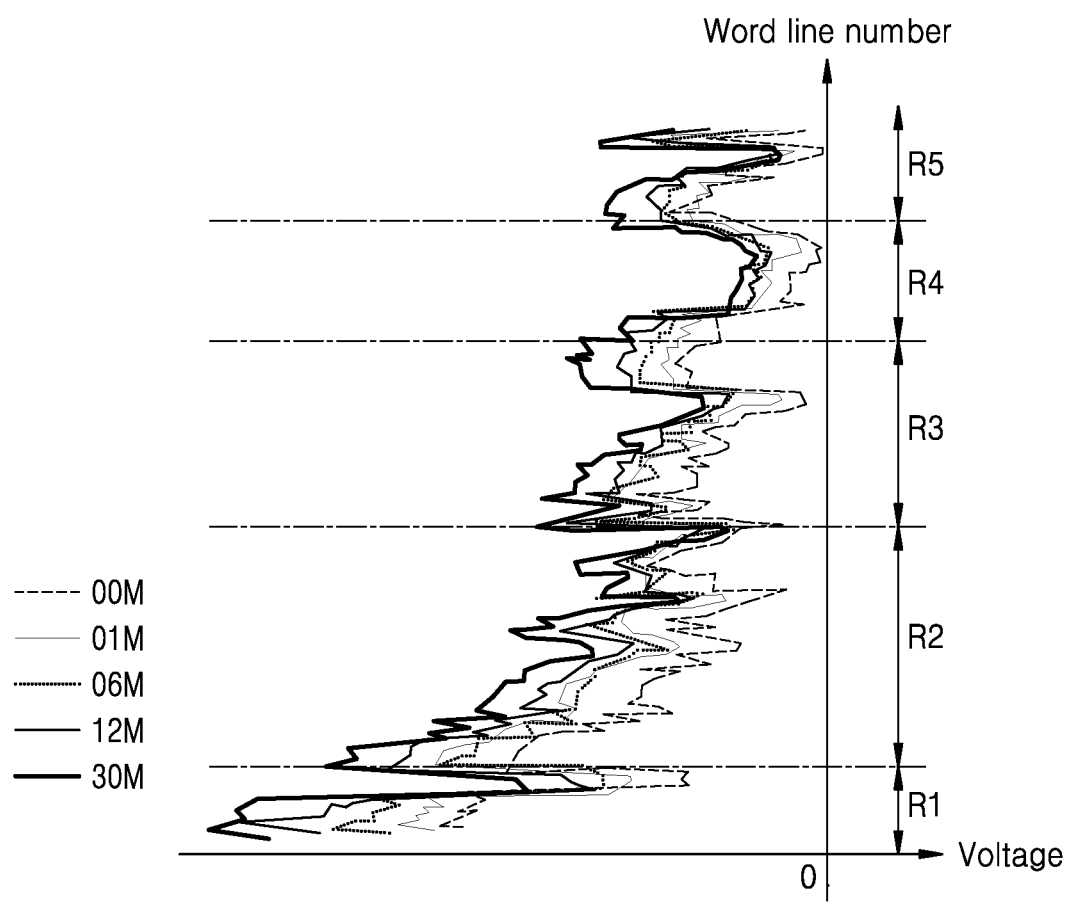
FIG. 11 is a graph showing word line skew with respect to a retention time.

FIG. 11 is a graph showing word line skew with respect to a retention time. For example, FIG. 11 shows skew in upper and lower word lines. Here, the skew may correspond to a difference in a certain optimal read voltage (or the amount of shift of a read voltage from a default read voltage).

Referring to FIG. 11, at a certain retention time, the amount of shift of a read voltage corresponding to an upper word line may be less than the amount of shift of a read voltage corresponding to a lower word line. For example, the amount of shift of a read voltage in the fifth region R5 may be less than the amount of shift of a read voltage in the first region R1. In other words, skew in a lower word line may be greater than skew in an upper word line. This is because, as described above with reference to FIGS. 4 and 5, the size of a pillar corresponding to a word line decreases toward a substrate and the word line is degraded more and vulnerable to degradation as the size of the pillar decreases. As described above, because a skew difference increases with the elapse of a retention time, a read pass probability may decrease when one degradation compensation level is applied to a read voltage regardless of the position of a word line. Accordingly, in an embodiment, as the vertical level (e.g., position) of a word line corresponding to a physical page storing data to be read increases based on a lower substrate (e.g., the substrate SUB) of a non-volatile memory, a degradation compensation level corresponding to the word line may decrease. According to the embodiment described above, a read pass probability may increase.

Figure 12:
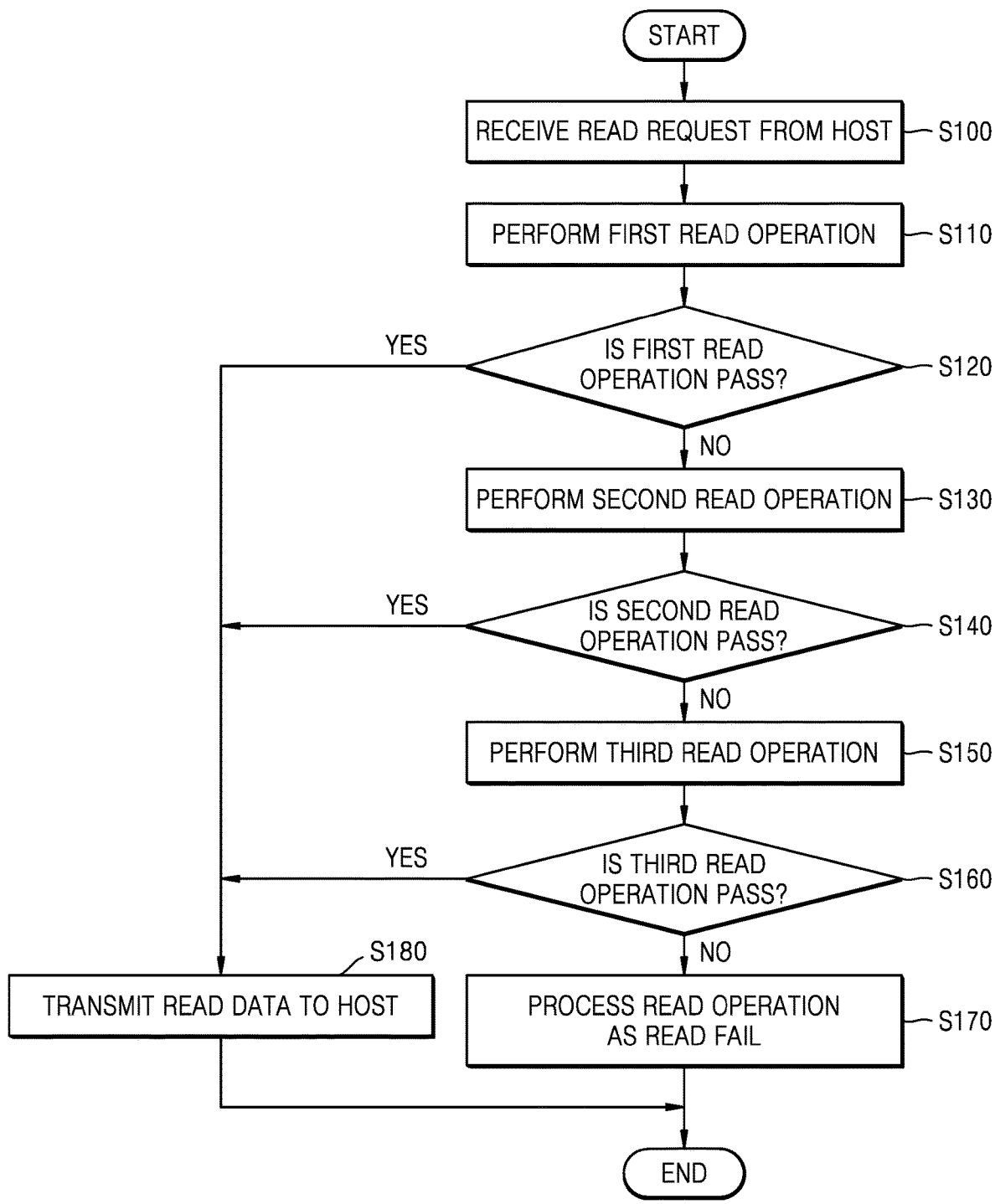
FIG. 12 is a flowchart of an operating method of a storage device, according to an embodiment of the inventive concept.

FIG. 12 is a flowchart of an operating method of a storage device, according to an embodiment.

Referring to FIG. 12, a read request may be received from a host in operation S100.

In response to the read request from the host, a first read operation may be performed in operation S110. The first read operation may correspond to an operation of reading, by the non-volatile memory 120, data by using a default read voltage set. The first read operation may be referred to as a normal read operation.

A pass or a fail of the first read operation may be determined in operation S120. The pass of the first read operation may be determined when read data is normal data or includes an error correctable by the ECC circuit 113. In an embodiment, the read manager 112 may determine the pass or fail of the first read operation according to whether an error in the read data is correctable by the ECC circuit 113. In some embodiments, operation S120 may include detecting an error in the data read by the first read operation.

When the fail of the first read operation is determined (i.e., in case of NO in operation S120), a second read operation may be performed in operation S130. The second read operation may correspond to an operation of reading data based on a history read voltage set. For example, the second read operation may be carried out by calculating a degradation compensation level based on at least one weight table, at least one offset table, and a displacement level, calculating the history read voltage set by performing an operation on the default read voltage set and the degradation compensation level, and reading the data based on the history read voltage set. In other words, the second read operation is performed by determining a degradation compensation level using one or more weight tables, one or more offset tables, and a displacement level. Then, the history read voltage set is calculated by using the default read voltage set and the degradation compensation level. Finally, the data is read using the calculated history read voltage set. The second read operation may be referred to as a history read operation.

A pass or a fail of the second read operation may be determined in operation S140. In an embodiment, the read manager 112 may determine the pass or fail of the second read operation according to whether an error in the read data is correctable by the ECC circuit 113. In some embodiments, operation S140 may include detecting an error in the data read by the second read operation.

When the fail of the second read operation is determined (i.e., in case of NO in operation S140), a third read operation may be performed in operation S150. The third read operation may correspond to an operation of reading data based on an optimal read voltage set. The third read operation may be carried out by searching for a new optimal read voltage set by executing a recovery code, calculating and storing a displacement level, and reading the data based on the new optimal read voltage set. In other words, the third read operation entails executing a recovery code to find a new optimal read voltage set, determining and storing a displacement level, and then reading the data using the newly found optimal read voltage set. Here, the displacement level may refer to a value corresponding to the shift from a default read voltage level in the default read voltage set to an optimal read voltage level in the new optimal read voltage set.

A pass or a fail of the third read operation may be determined in operation S160. In an embodiment, the read manager 112 may determine the pass or fail of the third read operation according to whether an error in the read data is correctable by the ECC circuit 113. In some embodiments, operation S160 may include detecting an error in the data read by the third read operation. When the fail of the third read operation is determined (i.e., in case of NO in operation S160), a read operation may be processed as a read fail in operation S170.

When the pass of the first read operation is determined (in case of YES in operation S120), when the pass of the second read operation is determined (in case of YES in operation S140), or when the pass of the third read operation is determined (in case of YES in operation S160), the read data may be transmitted to the host in operation S180.

As described above, when a value for read voltage compensation is differently calculated with respect to each word line, a read pass probability may increase and the performance and reliability of the storage device 100 may also increase.

Figure 13:
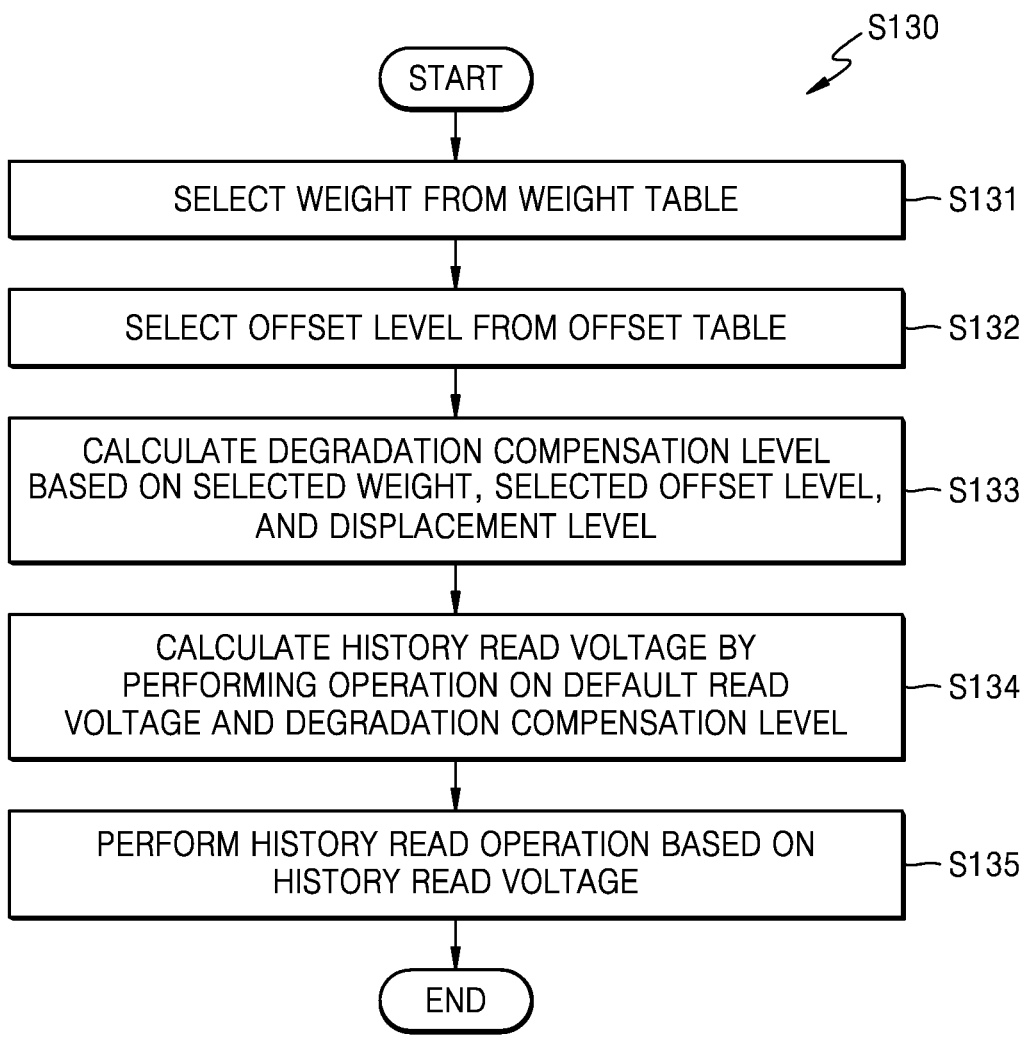
FIG. 13 is a flowchart of a second read operation in FIG. 12.

FIG. 13 is a flowchart of the second read operation in FIG. 12. FIGS. 14A and 14B are diagrams respectively showing a weight table α and an offset table β, according to an embodiment.

Referring to FIG. 13, a weight may be selected from the weight table α, according to a word line corresponding to a physical page storing the data, in operation S131. The weight table α may have a data structure shown in FIG. 14A. In the weight table α, each of a plurality of regions, e.g., first to N-th regions R1 to RN, may correspond to a word line group. Each word line group may include at least one word line. The first region R1 may correspond to a first word line group of a word line WL0 corresponding to word line number 0 to a word line WL11 corresponding to word line number 11. In other words, the first region R1 may correspond to a group of word lines including WL0-WL11. However, embodiments are not limited thereto. In the weight table α, the kinds of state read voltages (RP1-RP7) may be determined according to the kind of memory cell (e.g., SLC, MLC, TLC, or the like). For example, referring to FIGS. 6 to 14A, when a memory cell is a TLC, there may be seven kinds of state read voltages RP1 to RP7 as shown in FIG. 14A because the TLC may be in one of the erase state E and the first to seventh program states P1 to P7. However, embodiments are not limited thereto. In some embodiments, when a memory cell is an SLC, there may be one kind of state read voltages in the weight table α because the SLC may be in the erase state E or the first program state P1. When a memory cell is an MLC, there may be three kinds of state read voltages in the weight table α because the MLC may be in one of the erase state E and the first to third program states P1 to P3. When a memory cell is a QLC, there may be fifteen kinds of state read voltages in the weight table α because the QLC may be in one of the erase state E and fifteen program states.

A weight may be selected based on an address provided to the non-volatile memory 120. In other words, a weight, which matches a word line group including a word line selected by an address, may be selected from the weight table α. For example, referring to FIGS. 1 and 14A, when the selected word line is the word line WL0 corresponding to the word line number 0, a selected weight may be 1.2, 1.3, 3.1, 3.9, 2, 1.6, or 1.4. Operation S131 may be performed by the read manager 112.

In an embodiment, when there are a plurality of weight tables, operation S131 may include selecting one of the weight tables according to a degradation parameter. This selecting operation is described with reference to FIG. 16 below.

An offset level may be selected from the offset table β, according to a word line, in operation S132. The offset table β may have a data structure shown in FIG. 14B. In the offset table β, the first to N-th regions R1 to RN and the state read voltages RP1 to RP7 may be defined. An offset level may be selected based on an address provided to the non-volatile memory 120. For example, referring to FIG. 14B, when the selected word line is a word line WL12 corresponding to word line number 12, a selected offset level may be −35, −20, −45, or −40. Operation S132 may be performed by the read manager 112.

In an embodiment, when there are a plurality of offset tables, operation S132 may include selecting one of the offset tables according to a degradation parameter. This selecting operation is described with reference to FIG. 16 below.

A degradation compensation level may be calculated based on the selected weight, the selected offset level, and a displacement level in operation S133.

In an embodiment, function data representing an operational function and a value of the displacement level may be stored in the cache memory 111. In this case, the read manager 112 may apply the selected weight, the selected offset level, and the displacement level to a preset operational function and calculate a result value of the preset operational function as the degradation compensation level. For example, the read manager 112 may calculate the degradation compensation level by applying the selected weight to the displacement level and performing an operation on a weighted result, the selected offset level, and the displacement level. An example of the operational function is Equation 1.

$$V_{dcl} = \Delta + \alpha_s * \Delta + \beta_s. \quad \text{[Equation 1]}$$

Here, $V_{dcl}$ may be the degradation compensation level, $\Delta$ may be the displacement level, $\alpha_s$ may be the selected weight, and $\beta_s$ may be the selected offset level. For example, referring to FIGS. 14A and 14B, when the selected word line has word line number 0 (see "R1" in FIGS. 14A and 14B), the weight and the offset level that are selected based on the state read voltage RP1 are respectively 1.2 and −30. Assuming that the displacement level, $\Delta$, is −100 [mV], the degradation compensation level, $V_{dcl}$, calculated using Equation 1 may be −250 [mV]. Equation 1 is just an example, and embodiments are not limited thereto. A second- or higher-order polynomial with respect to a displacement level, a weight, and/or an offset may be applied to embodiments. Additionally, a polynomial, a non-linear equation with respect to a displacement level, a weight, and/or an offset may be applied to embodiments. When a compensation level for read voltage compensation is calculated using a relatively simple equation like Equation 1, applicability to real products (or mass productivity) may be increased. In addition, the resources of the storage device 100 may be reduced, the read capability thereof may be prevented from decreasing, and the high read capability thereof may be secured according to the use of relatively less resources. When a more sophisticated equation than Equation 1 is used, a compensation level for read voltage compensation may be more accurately calculated, and accordingly, the read capability of the storage device 100 may be increased.

In some embodiments, data about a machine learning model that has been trained in advance may be stored in the memory controller 110. In this case, the read manager 112 may input the selected weight, the selected offset level, and the displacement level to the machine learning model and calculate a value output from the machine learning model as the degradation compensation level. The machine learning model may include a deep learning model, a convolutional neural network (CNN) model, or a recurrent neural network (RNN) model.

A history read voltage level may be calculated by performing an operation on the degradation compensation level and a default read voltage level in operation S134. For example, the history read voltage level, $V_{histo}$, may be equal to the sum of the default read voltage level, $V_{default}$, and the degradation compensation level, Vdcl, as shown in Equation 2.

$$V_{histo} = V_{default} + V_{dcl}. \quad \text{[Equation 2]}$$

A history read operation may be performed by reading the stored data based on the history read voltage level in operation S135.

The total number of word lines and the kinds of state read voltages are not limited to those shown in FIGS. 14A and 14B.

According to the embodiments described above, when a compensation level for read voltage compensation is calculated using a simple first-order operational function, applicability to real products (or mass productivity) may be increased, the resources of the storage device 100 may be reduced, and the high read capability thereof may be secured according to the use of relatively less resources.

According to the embodiments described above, when a compensation level for read voltage compensation is calculated using a relatively sophisticated operational function, the processing speed, accuracy, and read capability of the storage device 100 may be increased.

As one of degradation parameters causing degradation, a P/E cycle may vary with a memory block and a degradation degree may vary with the size of a P/E cycle, and accordingly, the degradation degree may be different among memory blocks. Therefore, an appropriate weight table and an appropriate offset table should to be selected for each memory block according to the P/E cycle thereof.

Figure 15:
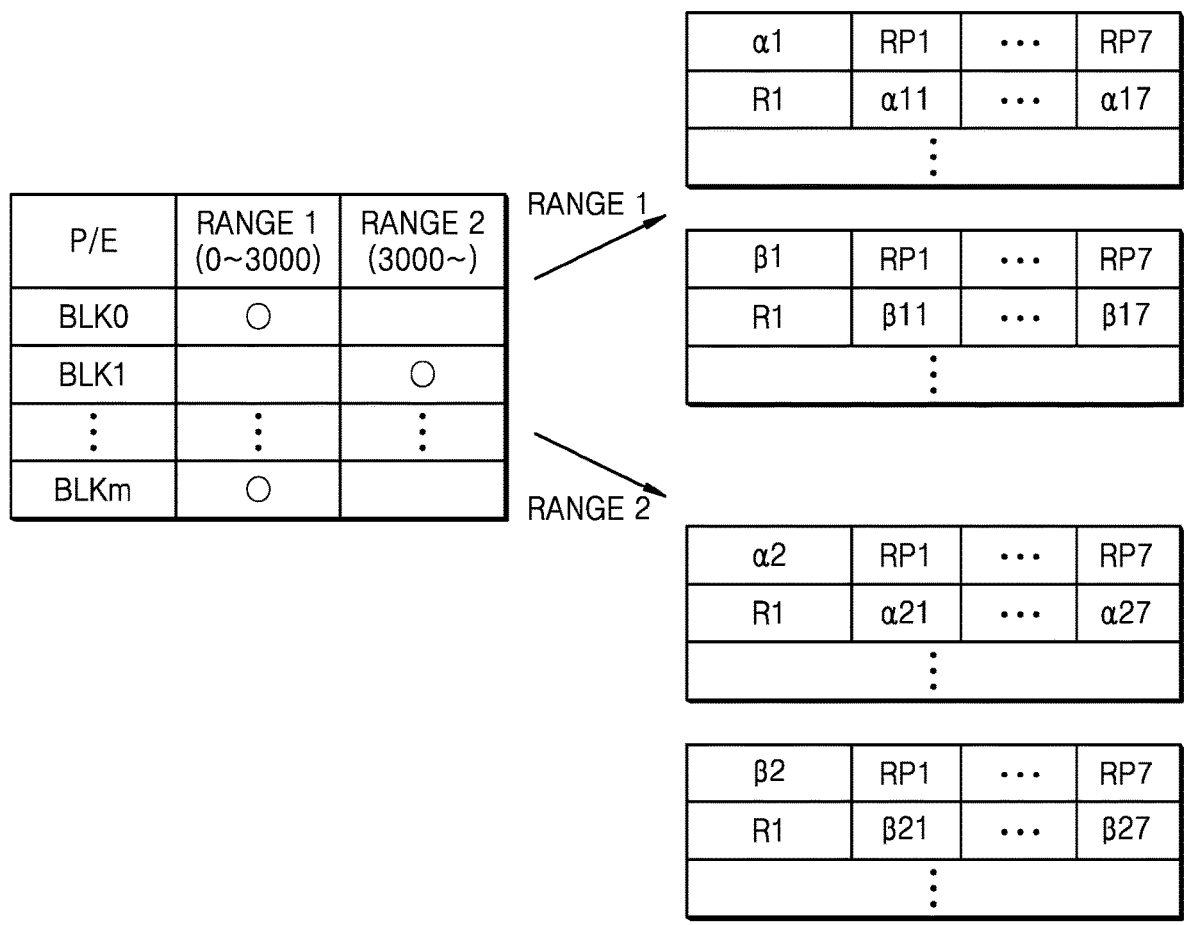
FIG. 15 is a diagram showing weight tables and offset tables, according to some embodiments of the inventive concept.

FIG. 15 is a diagram showing weight tables and offset tables, according to some embodiments.

Referring to FIGS. 1 and 15, a P/E count table β/E may be a degradation parameter table and have a data structure including the number of P/E cycles (hereinafter, referred to as a P/E count) of the non-volatile memory 120 with respect to each of memory blocks BLK0 to BLKm included in the non-volatile memory 120, where "m" is a natural number. The P/E count table β/E may be stored in the non-volatile memory 120 as metadata. When the storage device 100 is booted, the P/E count table β/E may be loaded to the memory controller 110. The P/E count table β/E may be stored in the cache memory 111. To reduce the size of the P/E count table β/E, the P/E count table β/E may include a plurality of ranges, e.g., a first range RANGE 1 and a second range RANGE 2, each of which indicates a certain range of P/E counts. Although two ranges, i.e., the first and second ranges RANGE 1 and RANGE 2, are illustrated in FIG. 15, embodiments are not limited thereto. At least three ranges may be included in the P/E count table β/E. For example, the first range RANGE 1 may be from 0 to 3000, and the second range RANGE 2 may be over 3000. For example, the P/E count of the memory block BLK0 corresponding to memory block number 0 may be included in the first range RANGE 1, the P/E count of the memory block BLK1 corresponding to memory block number 1 may be included in the second range RANGE 2, and the P/E count of the memory block BLKm corresponding to memory block number m may be included in the first range RANGE 1. Which range the P/E count of each memory block is included may be expressed as a bit value (e.g., "0" or "1") in the P/E count table β/E.

According to some embodiments, there may be at least two weight tables and at least two offset tables. For example, a first weight table α1, a second weight table α2, a first offset table β1, and a second offset table β2 may be stored in the cache memory 111. For example, the first weight table al and the first offset table β1 may be selected when the P/E count of a selected memory block is in the first range RANGE 1. The second weight table α2 and the second offset table β2 may be selected when the P/E count of a selected memory block is in the second range RANGE 2.

In an embodiment, it is assumed that the first weight table al and the first offset table β1 are selected when the P/E count of a selected memory block is in the first range RANGE 1. In this case, with respect to the same word line group and the same read voltage, a weight in the first weight table al may be less than a weight in the second weight table α2. With respect to the same word line group and the same read voltage, an offset level in the first offset table 131 may be less than an offset level in the second offset table β2. For example, with respect to the first region R1 and the state read voltage RP1, a weight all in the first weight table α1 may be less than a weight α21 in the second weight table α2. In addition, an offset level β11 in the first offset table β1 may be less than an offset level β21 in the second offset table β2.

Although a P/E count is assumed to be a degradation parameter in FIG. 15, embodiments are not limited thereto. In some embodiments, a degradation parameter may include at least one selected from the group consisting of the number of error bits in data read based on an optimal read voltage set, temperature of a non-volatile memory, and a read count of the non-volatile memory.

Figure 16:
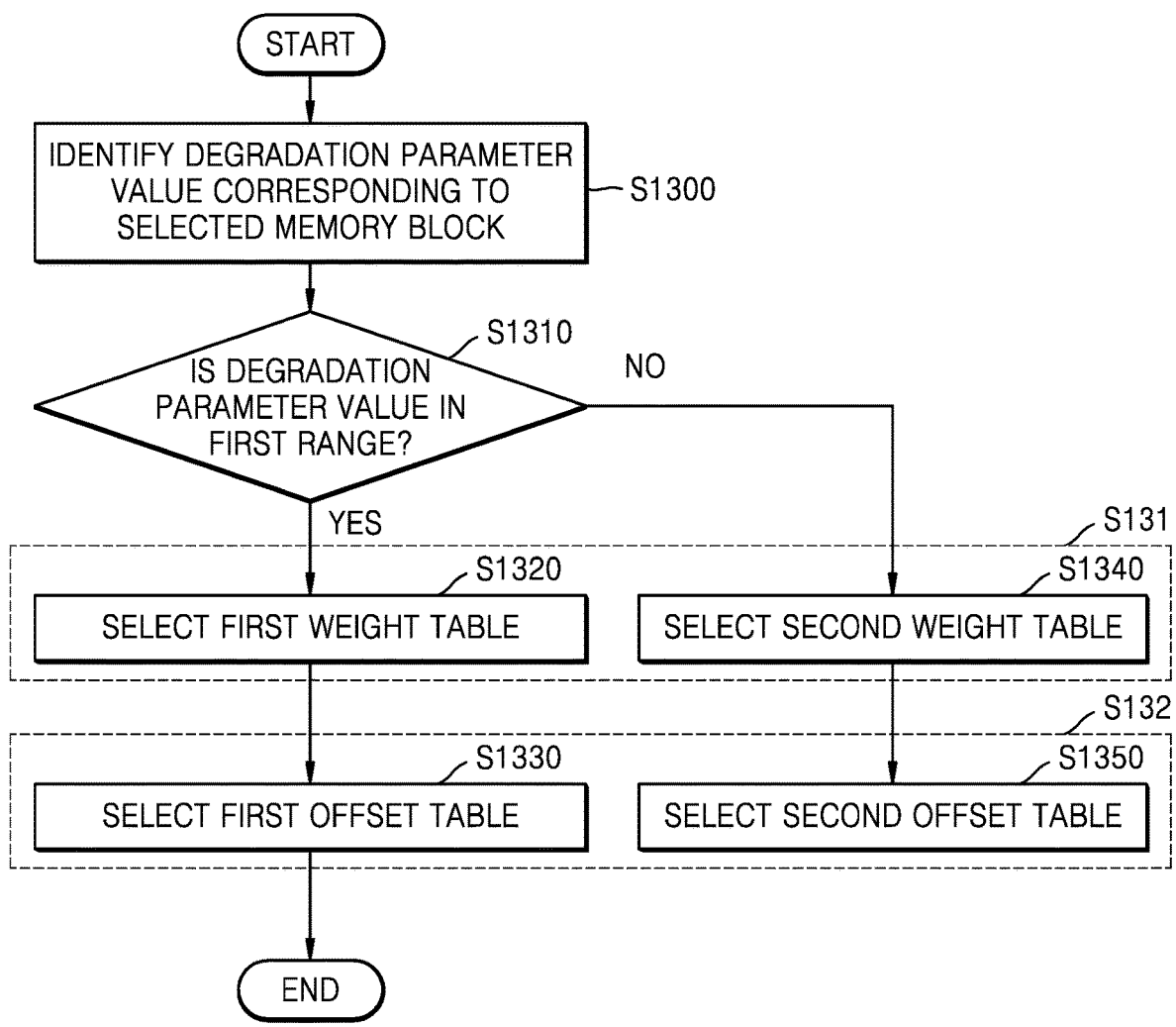
FIG. 16 is a flowchart of a method of selecting a weight table and an offset table, according to an embodiment of the inventive concept.

FIG. 16 is a flowchart of a method of selecting a weight table and an offset table, according to an embodiment.

Referring to FIGS. 15 and 16, a degradation parameter value corresponding to a selected memory block may be identified in operation S1300. Whether the degradation parameter value is in a first range may be identified in operation S1310. For example, referring to FIG. 15, when the selected memory block corresponds to memory block number 0 (e.g., BLK0), the read manager 112 may identify that the P/E count of the selected memory block (i.e., BLK0) is in the first range RANGE 1 (0-3000) in the P/E count table β/E.

When the degradation parameter value is in the first range (in case of YES) in operation S1310, a first weight table may be selected in operation S1320. A first offset table may be selected in operation S1330.

Otherwise, when the degradation parameter value is not in the first range, for example, when the degradation parameter value is in a second range, in which the minimum value is greater than the maximum value of the first range, (in case of NO) in operation S1310, a second weight table may be selected in operation S1340. A second offset table may be selected in operation S1350.

Operations S1300 to S1350 may be performed by the read manager 112. For example, the read manager 112 may detect a degradation parameter of the selected memory block, which includes a selected word line corresponding to a physical page storing data to be read, among a plurality of memory blocks in a degradation parameter table (see S1300). The read manager 112 may select one of a plurality of weight tables according to the degradation parameter of the selected memory block (see S1310 and S131). When the value of the degradation parameter of the selected memory block is in the first range (in case of YES in operation S1310), the read manager 112 may select the first weight table and the first offset table (see S1310, S1320, and S1330). The read manager 112 may select one of a plurality of offset tables according to the degradation parameter of the selected memory block (see S1310 and S132). When the value of the degradation parameter of the selected memory block is in the second range, the read manager 112 may select the second weight table and the second offset table (see S1310, S1340, and S1350).

According to the description above, when an appropriate weight table and an appropriate offset table are selected for each of memory blocks respectively having different degradation degrees, based on a degradation parameter, the capability and reliability of the storage device 100 may be increased.

In an embodiment, a displacement level may be set for each memory block, and displacement levels respectively calculated for memory blocks may be stored in the cache memory 111.

Figure 17:
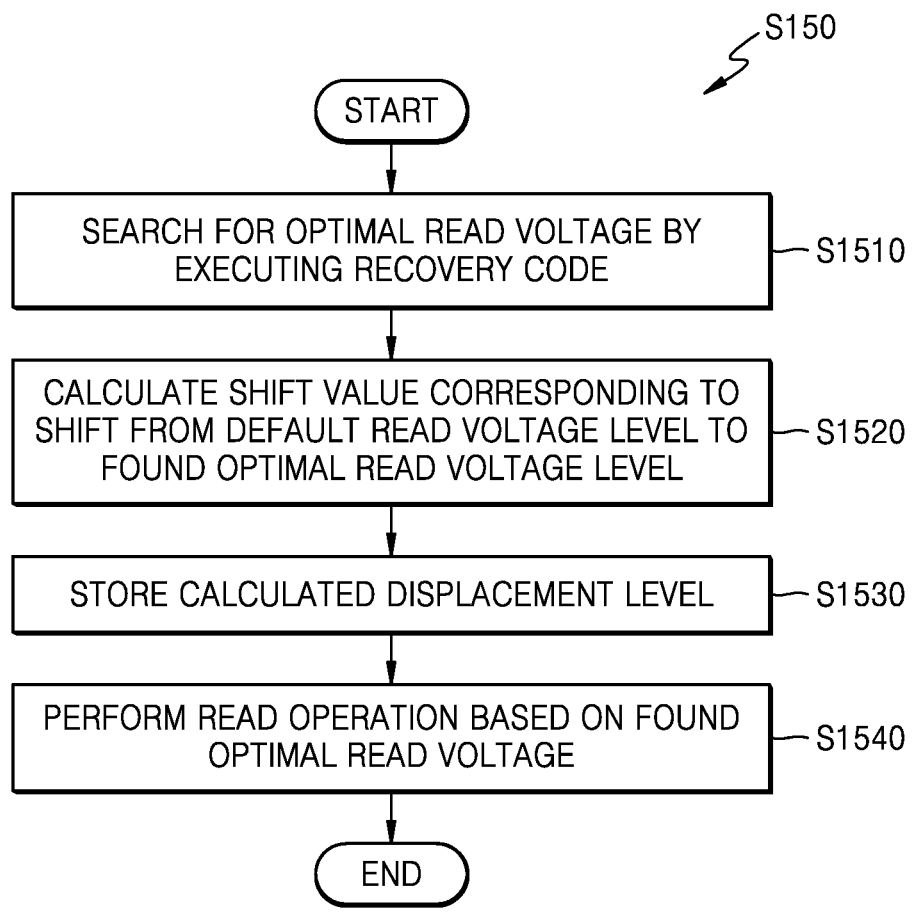
FIG. 17 is a flowchart of a third read operation in FIG. 12.

FIG. 17 is a flowchart of the third read operation in FIG. 12.

Referring to FIG. 17, a new optimal read voltage may be searched for by executing a recovery code in operation S1510. The optimal read voltage may be searched for by using the valley search described above with reference to FIG. 7.

A shift value corresponding to the shift from a default read voltage level to an optimal read voltage level may be calculated in operation S1520. For example, referring to FIG. 7, the default read voltage may be the seventh read voltage Vr7, and the found optimal read voltage may be the read voltage Vr7' having a level corresponding to the valley. A shift value corresponding to the shift from the seventh read voltage Vr7 to the read voltage Vr7' may correspond to the displacement level. The shift value may correspond to the difference between Vr7 and Vr7'.

The displacement level may be stored in operation S1530. In some embodiments, the displacement level may be stored in the cache memory 111. A displacement level update may be performed in operation S1530. In other words, the value of a displacement level stored in the cache memory 111 may be updated by storing the calculated displacement level in the cache memory 111. For example, the read manager 112 may update the displacement level, which is calculated by using the recovery code, in the cache memory 111.

An operation of reading the stored data may be performed based on the found optimal read voltage level (or a new optimal read voltage set) in operation S1540.

Figure 18:
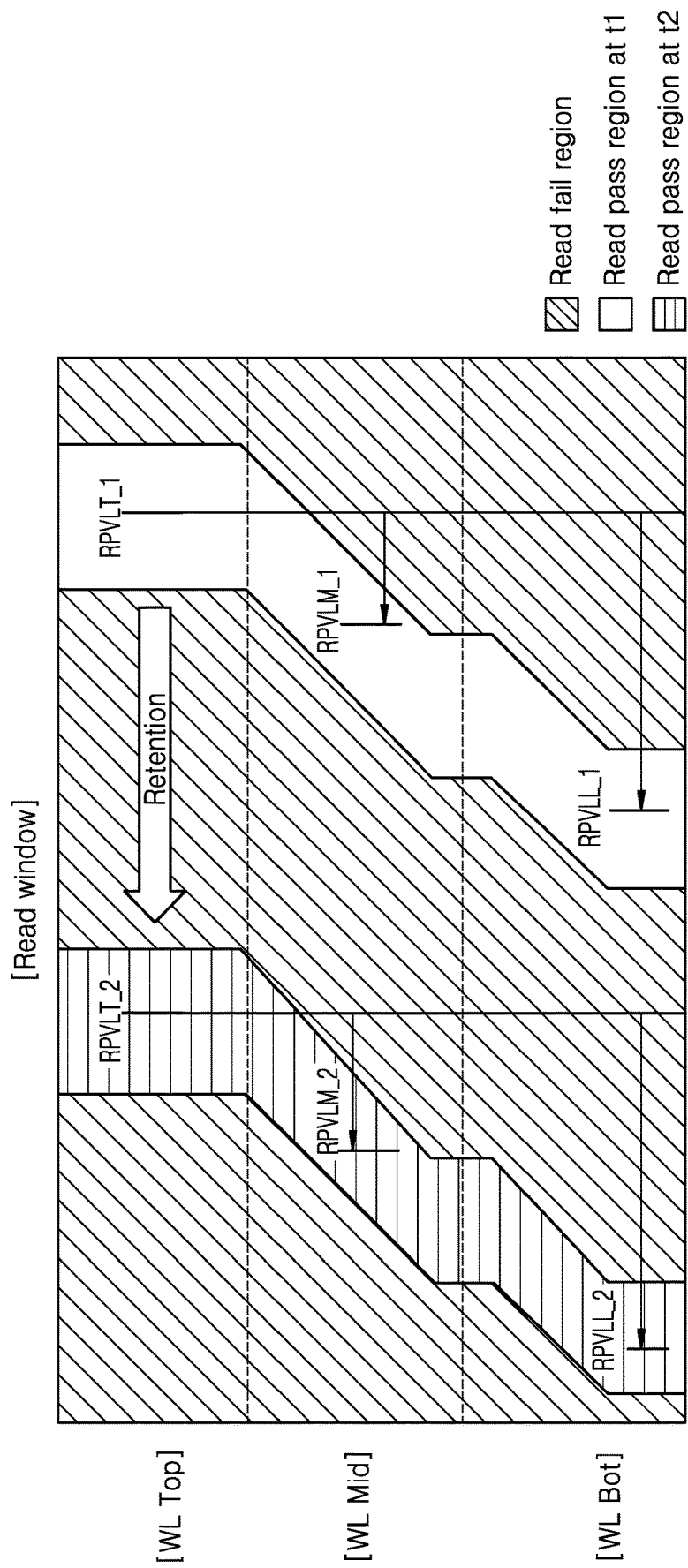
FIG. 18 is a diagram illustrating a read window including a read pass period varying with retention.

FIG. 18 is a diagram illustrating a read window including a read pass period varying with retention.

Referring to FIG. 18, a bottom word line WL_Bot may be positioned closer to the substrate SUB than a top word line WL_Top and a middle word line WL_Mid. The top word line WL_Top may be positioned farther from the substrate SUB than the bottom word line WL_Bot and the middle word line WL_Mid. The position of the middle word line WL_Mid may be between the position of the bottom word line WL_Bot and the position of the top word line WL_Top.

A read pass region in the read window may be different among the bottom word line WL_Bot, the middle word line WL_Mid, and the top word line WL_Top. Here, the read pass region may refer to a range of read voltages enabling a read pass. The remaining region of the read window excluding the read pass region may correspond to a read fail region.

Read voltages RPVLT_1, RPVLM_1, and RPVLL_1 may be included in a read pass region at a time point t1.

According to the embodiments described above, a read pass region may shift as a retention time elapses. In this case, because a degradation compensation level is differently calculated with respect to each word line, the amount of shift of a read voltage included in the read pass region may change. For example, a first shift amount from the read voltage RPVLT_1 to a read voltage RPVLT_2 may be the least, a second shift amount from the read voltage RPVLM_1 to a read voltage RPVLM_2 may be greater than the first shift amount, and a third shift amount from the read voltage RPVLL_1 to a read voltage RPVLL_2 may be greater than the second shift amount. Accordingly, the read voltages RPVLT_2, RPVLM_2, and RPVLL_2 may be included in a read pass region at a time point t2, and therefore, a read pass probability with respect to a word line may increase with the elapse of the retention time.

Figure 19A:
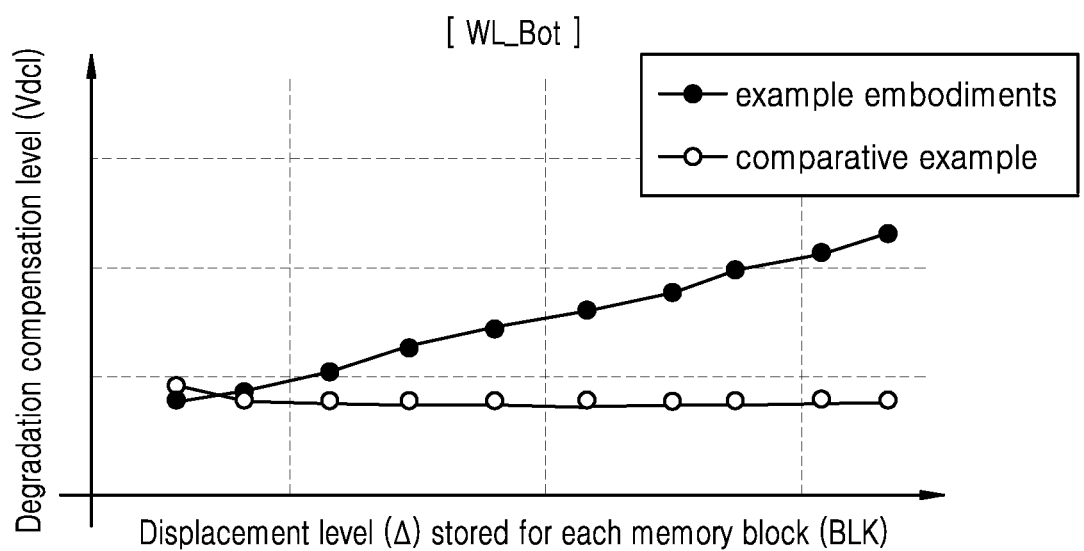
FIGS. 19A and 19B are schematic graphs of retention compensation level versus displacement level stored for each memory block.
Figure 19B:
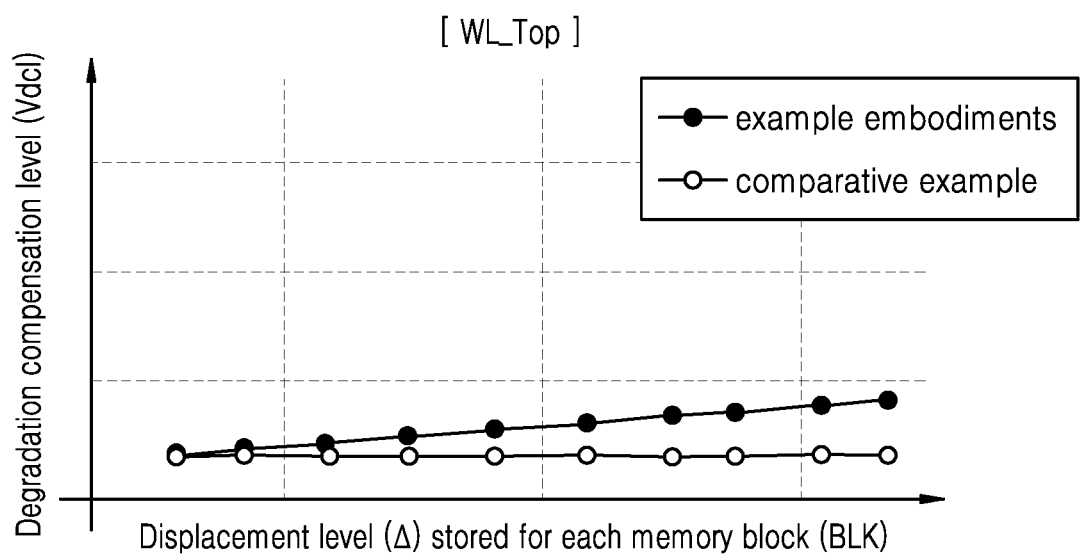

FIGS. 19A and 19B are schematic graphs of retention compensation level versus displacement level stored for each memory block. For example, FIG. 19A is a graph of a degradation compensation level with respect to a particular state read voltage (e.g., the state read voltage RP7 in FIG. 9) provided to the bottom word line WL_Bot, and FIG. 19B is a graph of a degradation compensation level with respect to the particular state read voltage (e.g., the state read voltage RP7 in FIG. 9) provided to the top word line WL_Top.

The displacement level, A, may represent a degradation degree of a memory cell. The displacement level, A, may vary with each memory block BLK. According to the embodiments, the storage device 100 may store a representative displacement level, A, for each memory block BLK by using a recovery code. In some embodiments, the displacement level, A, may be stored with respect to each of the lease significant bit (LSB) page, central significant bit (CSB) page, and most significant bit (MSB) page of a single memory block BLK. According to example embodiments, because the displacement level, A, is calculated and updated by using a recovery code in a read operation, a degradation compensation level for each word line may be back extracted (or back-tracked). Such a degradation compensation level for each word line may be back extracted by an equation expressing the characteristics of the amount of skew of each word line.

Referring to FIG. 19A, in the case of the example embodiments, as the displacement level, A, stored with respect to each memory block BLK increases, the degradation compensation level, $V_{dcl}$, with respect to the bottom word line WL_Bot may increase, based on the equations described above. In the case of a comparative example, because a degradation compensation level is indiscriminately determined through preliminary assessment, the degradation compensation level is constant regardless of the displacement level, A, stored with respect to each memory block BLK.

Referring to FIG. 19B, the degradation compensation level, $V_{dcl}$, with respect to the top word line WL_Top may vary with the displacement level, A, stored with respect to each memory block BLK. However, because of a difference in the size of a channel hole, the degradation of the top word line WL_Top is less than that of the bottom word line WL_Bot, and accordingly, the degradation compensation level, $V_{dcl}$, for the top word line WL_Top tends to be lower than that for the bottom word line WL_Bot. In the case of a comparative example, the degradation compensation level is constant regardless of the displacement level, A, stored with respect to each memory block BLK.

Figure 20:
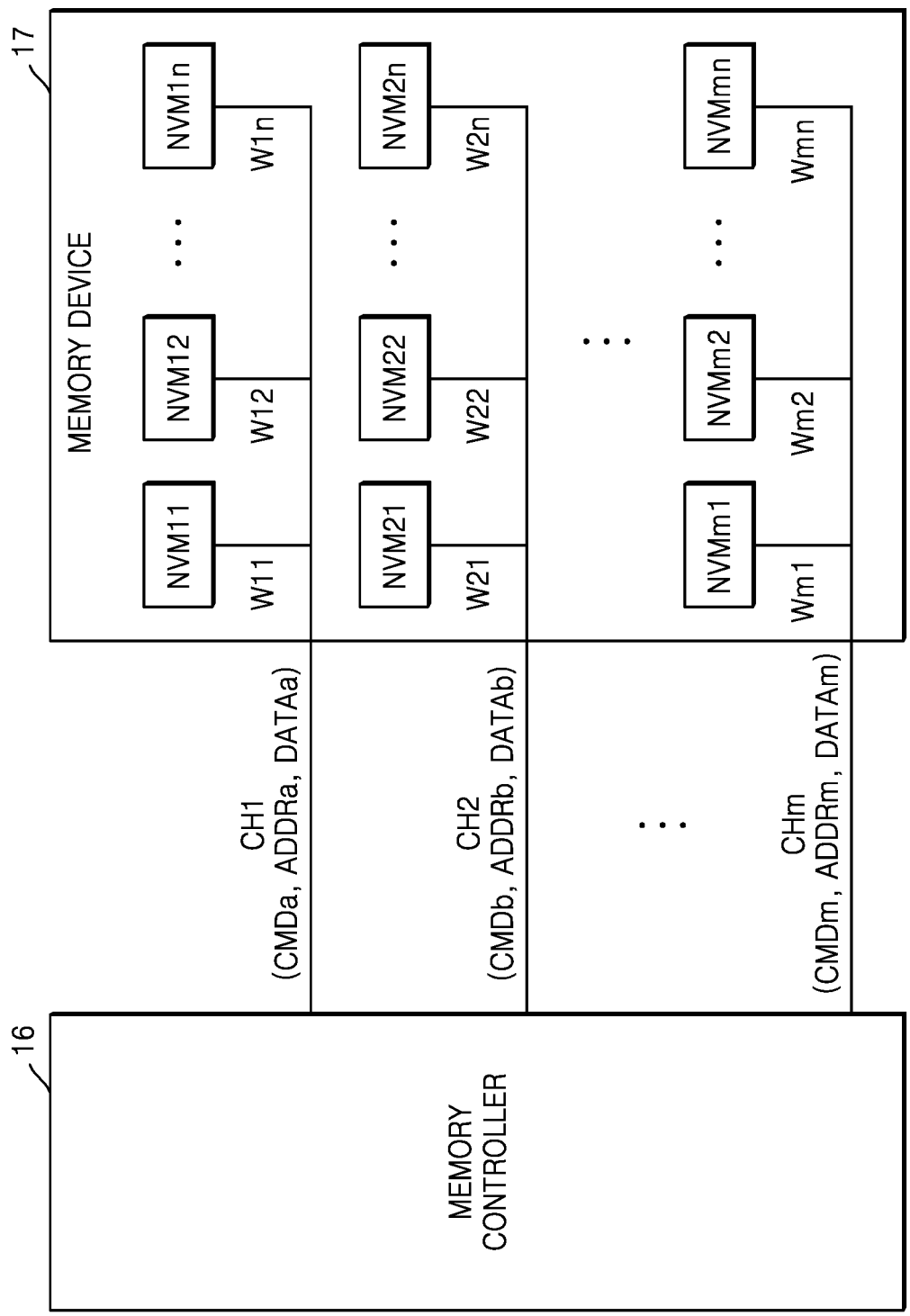
FIG. 20 is a block diagram of a memory system according to an embodiment of the inventive concept.

FIG. 20 is a block diagram of a memory system according to an embodiment.

Referring to FIG. 20, a memory system 15 may include a memory controller 16 and a memory device 17. The memory system 15 may support a plurality of channels CH1 to CHm, and the memory controller 16 and the memory device 17 may be connected to each other through the channels CH1 to CHm. For example, the memory system 15 may correspond to a storage device such as an SSD. The memory system 15 may be implemented to execute a recovery code.

The memory controller 16 may exchange signals with the memory device 17 through the channels CH1 to CHm. For example, the memory controller 16 may transmit commands CMDa to CMDm, addresses ADDRa to ADDRm, and data DATAa to DATAm to the memory device 17 through the channels CH1 to CHm and receive the DATAa to DATAm from the memory device 17 through the channels CH1 to CHm.

The memory controller 16 may select one non-volatile memory device among non-volatile memory devices NVM11 to NVM1n, MVM21 to NVM2n, or NVMm1 to NVMmn, which are connected to their corresponding one of the channels CH1 to CHm, and exchange signals with the selected non-volatile memory device through the corresponding channel. For example, the memory controller 16 may select the non-volatile memory device NVM11 among the non-volatile memory devices NVM11 to NVM1n connected to the channel CH1. The memory controller 16 may transmit the command CMDa, the address ADDRa, and the data DATAa to the non-volatile memory device NVM11 or receive the data DATAa from the non-volatile memory device NVM11 through the channel CH1.

The memory controller 16 may exchange signals in parallel with the memory device 17 through different channels. For example, while the memory controller 16 is transmitting the command CMDa to the memory device 17 through the channel CH1, the memory controller 16 may transmit the command CMDb to the memory device 17 through the channel CH2. For example, while the memory controller 16 is receiving the data DATAa from the memory device 17 through the channel CH1, the memory controller 16 may receive the data DATAb from the memory device 17 through the channel CH2.

The memory controller 16 may control the operations of the memory device 17. The memory controller 16 may transmit signals to the channels CH1 to CHm and thus individually control the non-volatile memory devices NVM11 to NVMmn connected to the channels CH1 to CHm. For example, the memory controller 16 may transmit the command CMDa and the address ADDRa to the channel CH1 and thus control a non-volatile memory device selected from the non-volatile memory devices NVM11 to NVM1n.

The memory device 17 may include the non-volatile memory devices NVM11 to NVMmn. Each of the non-volatile memory devices NVM11 to NVMmn may be connected to one of the channels CH1 to CHm through its corresponding way. For example, the non-volatile memory devices NVM11 to NVM1n may be connected to the channel CH1 through ways W11 to W1n, respectively, the non-volatile memory devices NVM21 to NVM2n may be connected to the channel CH2 through ways W21 to W2n, respectively, and the non-volatile memory devices NVMm1 to NVMmn may be connected to the channel CHm through ways Wm1 to Wmn, respectively. In an embodiment, each of the non-volatile memory devices NVM11 to NVMmn may be implemented in a certain memory unit, which may operate according to an individual command from the memory controller 16. For example, each of the non-volatile memory devices NVM11 to NVMmn may be implemented in a chip or a die. However, embodiments are not limited thereto.

Each of the non-volatile memory devices NVM11 to NVMmn may operate under control by the memory controller 16. For example, the non-volatile memory device NVM11 may program the data DATAa according to the command CMDa, the address ADDRa, and the data DATAa, which are provided to the channel CH1. For example, the non-volatile memory device NVM21 may read the data DATAb according to the command CMDb and the address ADDRb, which are provided to the channel CH2, and transmit the data DATAb to the memory controller 16.

Although it is illustrated in FIG. 20 that the memory device 17 communicates with the memory controller 16 through "m" channels and the memory device 17 includes "n" non-volatile memory devices in correspondence to each channel, the number of channels and the number of non-volatile memory devices connected to each channel may be variously changed.

According to an embodiment, a non-volatile memory device may have a chip-to-chip (C2C) structure. A non-volatile memory device having a C2C structure is described with reference to FIG. 23 below.

Figure 21:
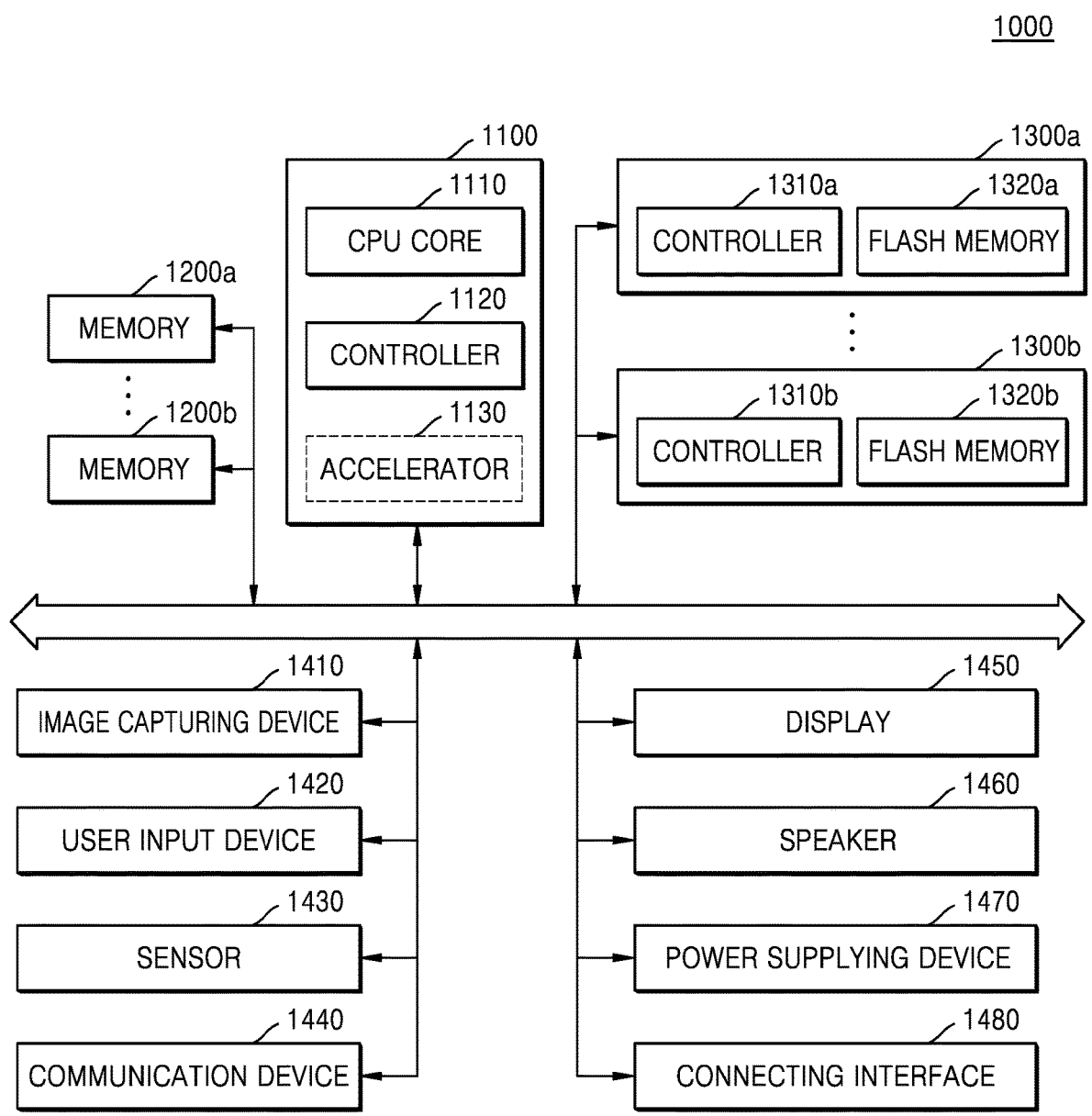
FIG. 21 is a block diagram of a system including a storage device, according to an embodiment of the inventive concept.

FIG. 21 is a block diagram of a system including a storage device, according to an embodiment.

Referring to FIG. 21, a system 1000 may be a mobile system, such as a mobile phone, a smartphone, a tablet PC, a wearable device, a healthcare device, or an Internet of things (IoT) device. However, the system 1000 of FIG. 21 is not limited thereto and may correspond to a PC, a laptop computer, a server, a media player, or an automotive device like a navigation device.

The system 1000 may include a main processor 1100, memories 1200a and 1200b, and storage devices 1300a and 1300b and may further include at least one selected from the group consisting of an image capturing device 1410, a user input device 1420, a sensor 1430, a communication device 1440, a display 1450, a speaker 1460, a power supplying device 1470, and a connecting interface 1480.

The main processor 1100 may control the operations of the system 1000, and more particularly, the operations of the other elements of the system 1000. The main processor 1100 may correspond to a general-purpose processor, a dedicated processor, or an application processor.

The main processor 1100 may include at least one central processing unit (CPU) core 1110 and further include a controller 1120, which controls the memories 1200a and 1200b and/or the storage devices 1300a and 1300b. According to an embodiment, the main processor 1100 may further include an accelerator 1130, which is a dedicated circuit for high-speed data operations such as artificial intelligence (AI) data operations. The accelerator 1130 may include a graphics processing unit (GPU), a neural processing unit (NPU), and/or a data processing unit (DPU) and may be implemented in a separate chip physically independent from other elements of the main processor 1100.

The memories 1200a and 1200b may be used as a main memory device of the system 1000 and may include volatile memory, such as SRAM and/or DRAM, or non-volatile memory, such as flash memory, PRAM, and/or resistive RAM (RRAM). The memories 1200a and 1200b may be implemented in the same package as the main processor 1100.

The storage devices 1300a and 1300b may include a non-volatile storage device that retains data regardless of power supply and may have a larger capacity than the memories 1200a and 1200b. The storage devices 1300a and 1300b may include storage controllers 1310a and 1310b, respectively, and non-volatile memories 1320a and 1320b, respectively. The non-volatile memory 1320a may store data under control by the storage controller 1310a, and the non-volatile memory 1320b may store data under control by the storage controller 1310b. The non-volatile memories 1320a and 1320b may include flash memory having a two-dimensional (2D) or three-dimensional (3D) vertical NAND (V-NAND) structure or other types of non-volatile memory, such as PRAM and/or RRAM.

The storage devices 1300a and 1300b may be physically separated from the main processor 1100 in the system 1000 or may be implemented in the same package as the main processor 1100. The storage devices 1300a and 1300b may have a form of an SSD or a memory card and may thus be removably coupled to other elements of the system 1000 through an interface, such as the connecting interface 1480, which will be described below. The storage devices 1300a and 1300b may include a device, to which a protocol, such as a UFS standard, an eMMC standard, or a non-volatile memory express (NVMe) standard, is applied, but are not necessarily limited thereto.

The image capturing device 1410 may capture a still image or a moving image and may include a camera, a camcorder, and/or a webcam. The user input device 1420 may receive various types of data input by a user of the system 1000 and may include a touch pad, a key pad, a keyboard, a mouse, and/or a microphone. The sensor 1430 may sense various types of physical quantities that may be acquired from outside the system 1000 and may convert sensed physical quantities into electrical signals. The sensor 1430 may include a temperature sensor, a pressure sensor, an illuminance sensor, a position sensor, an acceleration sensor, a biosensor, and/or a gyroscope sensor. The communication device 1440 may transmit or receive signals to or from other devices outside the system 1000 according to various communication protocols. The communication device 1440 may include an antenna, a transceiver, and/or a modem.

The display 1450 and the speaker 1460 may function as output devices that respectively output visual information and auditory information to the user of the system 1000. The power supplying device 1470 may appropriately transform power from a battery embedded in the system 1000 and/or an external power supply and may supply transformed power to each element of the system 1000. The connecting interface 1480 may provide a connection between the system 1000 and an external device, which is connected to the system 1000 and may exchange data with the system 1000. The connecting interface 1480 may include various interfaces, such as an ATA interface, a SATA interface, an e-SATA interface, an SCSI, a SAS, a PCI interface, a PCI-E interface, an NVMe interface, IEEE 1394, a USB interface, an SD card interface, an MMC interface, an eMMC interface, a UFS interface, an embedded UFS (eUFS) interface, and a CF card interface.

Figure 22:
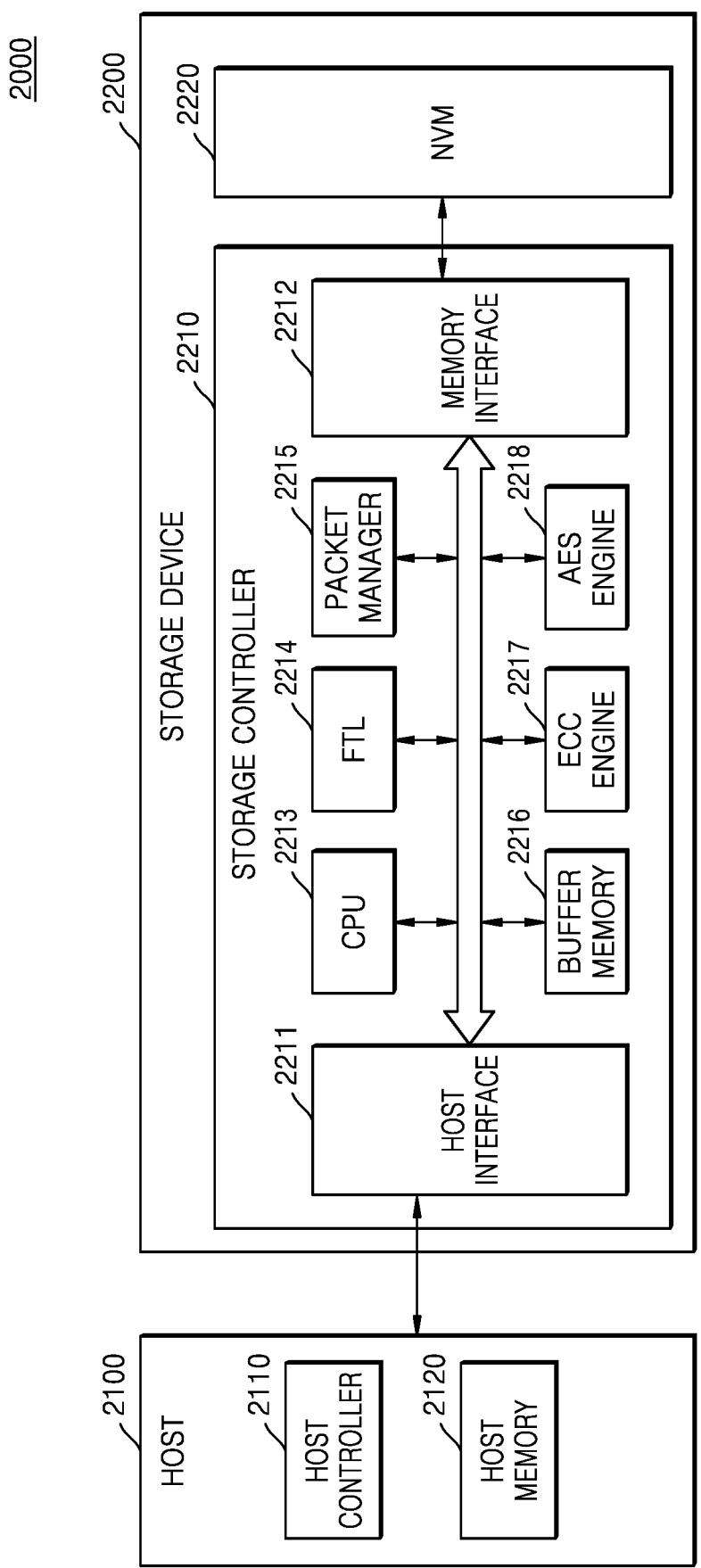
FIG. 22 is a block diagram of a storage system according to an embodiment of the inventive concept.

FIG. 22 is a block diagram of a storage system according to an embodiment.

Referring to FIG. 22, a storage system 2000 may include a host 2100 and a storage device 2200. The storage device 2200 may include a storage controller 2210 and an NVM 2220. According to an embodiment, the host 2100 may include a host controller 2110 and a host memory 2120. The host memory 2120 may function as a buffer memory, which temporarily stores data to be transmitted to the storage device 2200 or data received from the storage device 2200.

The storage device 2200 may include storage media for storing data according to the request of the host 2100. For example, the storage device 2200 may include at least one selected from the group consisting of an SSD, an embedded memory, and a removable external memory. When the storage device 2200 is an SSD, the storage device 2200 may comply with the NVMe standard. When the storage device 2200 is an embedded memory or an external memory, the storage device 2200 may comply with the UFS standard or the eMMC standard. Each of the host 2100 and the storage device 2200 may generate and transmit packets according to the standard protocol used thereby.

When the NVM 2220 of the storage device 2200 includes flash memory, the flash memory may include a 2D NAND memory array or a 3D or vertical NAND (VNAND) memory array. Alternatively, the storage device 2200 may include other various kinds of NVM. For example, the storage device 2200 may include MRAM, spin-transfer torque MRAM, conductive bridging RAM (CBRAM), FRAM, PRAM, RRAM, and other various kinds of memory.

According to an embodiment, the host controller 2110 and the host memory 2120 may be respectively implemented in separate semiconductor chips. In some embodiments, the host controller 2110 and the host memory 2120 may be integrated into a single semiconductor chip. For example, the host controller 2110 may correspond to one of a plurality of modules included in an application processor. The application processor may include a system-on-chip (SoC). The host memory 2120 may include a memory embedded in an application processor or a memory module or NVM outside the application processor.

The host controller 2110 may control an operation of storing data (e.g., write data) of a buffer area of the host memory 2120 in the NVM 2220 or an operation of storing data (e.g., read data) of the NVM 2220 in the buffer area of the host memory 2120.

The storage controller 2210 may include a host interface 2211, a memory interface 2212, and a CPU 2213. The storage controller 2210 may further include a flash translation layer (FTL) 2214, a packet manager 2215, a buffer memory 2216, an ECC engine 2217, and an advanced encryption standard (AES) engine 2218. The storage controller 2210 may further include a working memory, to which the FTL 2214 is loaded. When the CPU 2213 executes the FTL 2214, a write or read operation of the NVM 2220 may be controlled.

The host interface 2211 may exchange packets with the host 2100. A packet transmitted from the host 2100 to the host interface 2211 may include a command or data to be written to the NVM 2220, and a packet transmitted from the host interface 2211 to the host 2100 may include a response to the command or data read from the NVM 2220. The memory interface 2212 may transmit data to be written to the NVM 2220 to the NVM 2220 or receive data read from the NVM 2220. The memory interface 2212 may be implemented to comply with a standard, such as Toggle or open NAND flash interface (ONFI).

The FTL 2214 may perform various functions, such as address mapping, wear leveling, and garbage collection. Address mapping is an operation of translating a logical address received from the host 2100 into a physical address used to actually store data in the NVM 2220. Wear leveling is technology for preventing excessive degradation of a block by allowing blocks of the NVM 2220 to be uniformly used. For example, the wear leveling may be implemented as a firmware technique for balancing the erase counts of physical blocks. Garbage collection is technology for securing the available capacity of the NVM 2220 by copying valid data of an old block to a new block and erasing the old block.

The packet manager 2215 may generate a packet according to an interface protocol agreed between the packet manager 2215 and the host 2100 or parse various kinds of information from a packet received from the host 2100. The buffer memory 2216 may temporarily store data to be written to the NVM 2220 or data read from the NVM 2220. The buffer memory 2216 may be included in the storage controller 2210 or may be provided outside the storage controller 2210.

The ECC engine 2217 may detect and correct an error in data read from the NVM 2220. For example, the ECC engine 2217 may generate parity bits with respect to data to be written to the NVM 2220, and the parity bits may be stored in the NVM 2220 together with the data. When data is read from the NVM 2220, the ECC engine 2217 may correct an error in the data using parity bits, which are read from the NVM 2220 together with the data, and may output error-corrected read data.

The AES engine 2218 may perform at least one selected from encryption and decryption of data input to the storage controller 2210 by using a symmetric-key algorithm.

Figure 23:
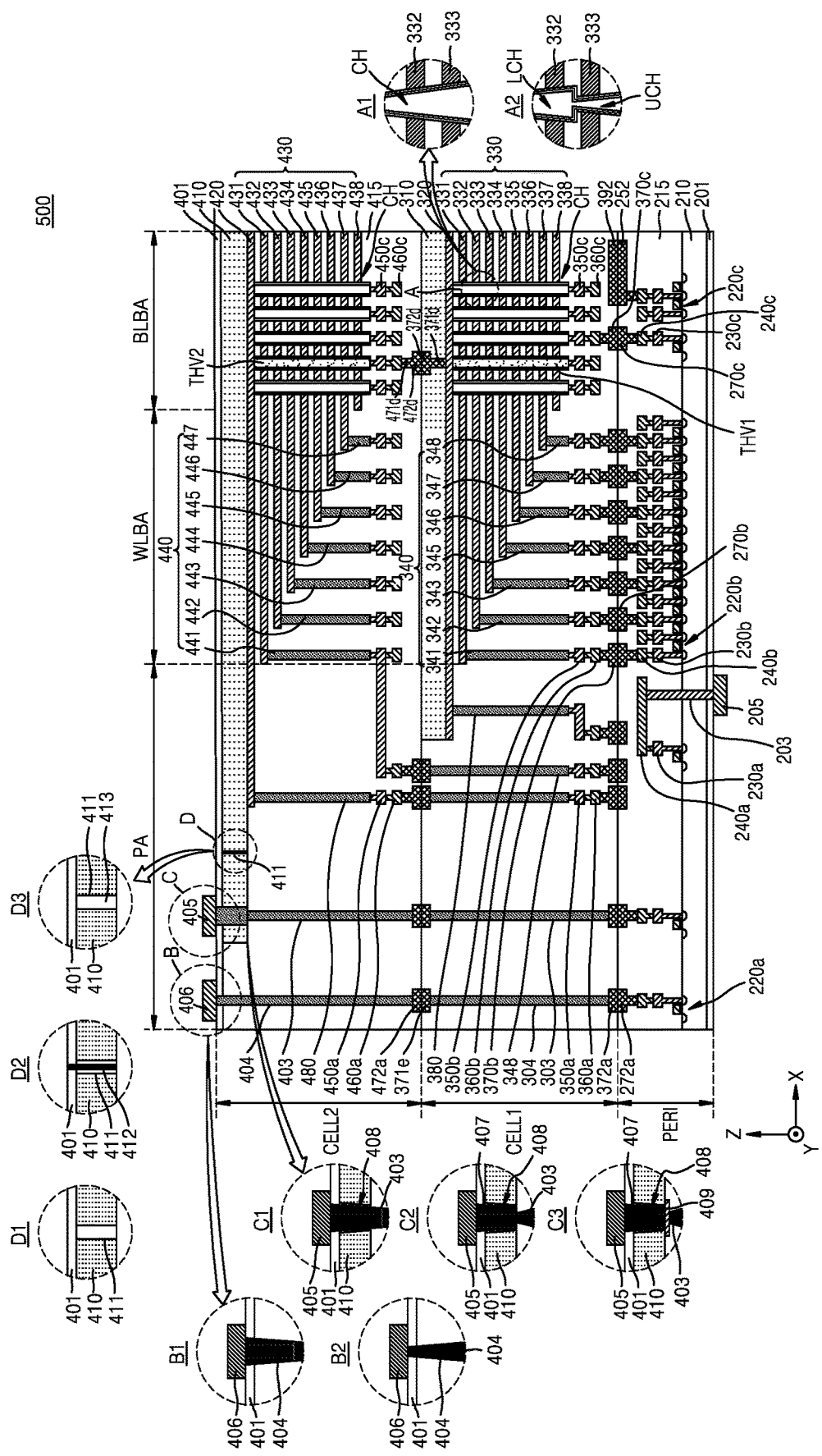
FIG. 23 is a diagram of a memory device according to an embodiment of the inventive concept.

FIG. 23 is a diagram of a memory device according to an embodiment.

Referring to FIG. 23, a memory device 500 may have a C2C structure. Here, the C2C structure may refer to a structure formed by manufacturing at least one upper chip including a cell region CELL, manufacturing a lower chip including a peripheral circuit region PERI, and then connecting the at least one upper chip to the lower chip in a bonding manner. For example, the bonding manner may include a method of electrically or physically connecting a bonding metal pattern formed on an uppermost metal layer of the upper chip to a bonding metal pattern formed on an uppermost metal layer of the lower chip. For example, when the bonding metal patterns include copper (Cu), the bonding manner may be Cu—Cu bonding. Alternatively, the bonding metal patterns may include aluminum (Al) or tungsten (W).

The memory device 500 may include at least one upper chip including a cell region. For example, the memory device 500 may include two upper chips. However, this is just an example, and the number of upper chips is not limited thereto. When the memory device 500 includes two upper chips, a first upper chip including a first cell region CELL1, a second upper chip including a second cell region CELL2, and a lower chip including the peripheral circuit region PERI may be separately manufactured and then connected to one another by a bonding manner such that the memory device 500 may be manufactured. The first upper chip may be reversed and connected to the lower chip by a boning manner, and the second upper chip may also be reversed and connected to the first upper chip by a bonding manner. In the description below, the upper and lower portions of each of the first and second upper chips are described based on before the reverse of the first and second upper chips. In other words, in FIG. 23, the upper portion of the lower chip is described based on a +Z direction, and the upper portion of each of the first and second upper chips is described based on a −Z direction. However, this is just an example, and only one of the first and second upper chips may be reversed and connected to the lower chip or the first upper chip by a bonding manner.

Each of the peripheral circuit region PERI and the first and second cell regions CELL1 and CELL2 of the memory device 500 may include an external pad bonding area PA, a word line bonding area WLBA, and a bit line bonding area BLBA.

The peripheral circuit region PERI may include a first substrate 210 and a plurality of circuit elements 220a, 220b, and 220c formed on the first substrate 210. An interlayer insulating layer 215 including at least one insulating layer may be on the circuit elements 220a, 220b, and 220c, and a plurality of metal interconnect lines connecting the circuit elements 220a, 220b, and 220c to one another may be in the interlayer insulating layer 215. For example, the metal interconnect lines may include first metal interconnect lines 230a, 230b, and 230c respectively connected to the plurality of circuit elements 220a, 220b, and 220c, and second metal interconnect lines 240a, 240b, and 240c formed on the first metal interconnect lines 230a, 230b, and 230c. The metal interconnect lines may include at least one conductive material. For example, the first metal interconnect lines 230a, 230b, and 230c may include tungsten having relatively high electrical resistivity, and the second metal interconnect lines 240a, 240b, and 240c may include copper having relatively low electrical resistivity.

Although the first metal interconnect lines 230a, 230b, and 230c and the second metal interconnect lines 240a, 240b, and 240c are shown and described in FIG. 23, embodiments are not limited thereto. One or more metal interconnect lines may be further formed on the second metal interconnect lines 240a, 240b, and 240c. In this case, the second metal interconnect lines 240a, 240b, and 240c may include aluminum. At least a portion of the one or more metal interconnect lines formed on the second metal interconnect lines 240a, 240b, and 240c may include copper or the like, which has a lower electrical resistivity than aluminum included in the second metal interconnect lines 240a, 240b, and 240c.

The interlayer insulating layer 215 may be on the first substrate 210 and include an insulating material, such as silicon oxide, silicon nitride, or the like.

Each of the first and second cell regions CELL1 and CELL2 may include at least one memory block. The first cell region CELL1 may include a second substrate 310 and a common source line 320. On the second substrate 310, a plurality of word lines 331 to 338 (i.e., 330) may be stacked in a direction (a Z-axis direction), perpendicular to the top surface of the second substrate 310. String selection lines may be on the word lines 330, and a ground selection line may be below the word lines 330. The word lines 330 may be between the string selection lines and the ground selection line. Similarly, the second cell region CELL2 may include a third substrate 410 and a common source line 420, and a plurality of word lines 431 to 438 (i.e., 430) may be stacked in the direction (the Z-axis direction), perpendicular to the top surface of the third substrate 410. The second substrate 310 and the third substrate 410 may include various materials. For example, the second substrate 310 and the third substrate 410 may include a silicon substrate, a silicon-germanium substrate, a germanium substrate, or a substrate having an epitaxial layer grown on a monocrystalline silicon substrate. A plurality of channel structures CH may be formed in each of the first and second cell regions CELL1 and CELL2.

In an embodiment, as shown in A1 of FIG. 23, a channel structure CH may be in the bit line bonding area BLBA and may extend in a direction, perpendicular to the top surface of the second substrate 310, and pass through the word lines 330, the string selection lines, and the ground selection line. The channel structure may include a data storage layer, a channel layer, a buried insulating layer, and the like. The channel layer may be electrically connected to a first metal interconnect line 350c and a second metal interconnect line 360c in the bit line bonding area BLBA. For example, the second metal interconnect line 360c may be a bit line 360c and connected to the first metal interconnect line 350c through the channel structure CH. The bit line 360c may extend in a first direction (a Y-axis direction), parallel to the top surface of the second substrate 310.

In an embodiment, as shown in A2 of FIG. 23, the channel structure CH may include a lower channel LCH and an upper channel UCH connected to the lower channel LCH. For example, the channel structure may be formed by a process for the lower channel LCH and a process for the upper channel UCH. The lower channel LCH may extend in a direction perpendicular to the top surface of the second substrate 310 and pass through the common source line 320 and the word lines 331 and 332. The lower channel LCH may include a data storage layer, a channel layer, a buried insulating layer, and the like and may be connected to the upper channel UCH. The upper channel UCH may pass through the word lines 333 to 338. The upper channel UCH may include a data storage layer, a channel layer, a buried insulating layer, and the like. The channel layer of the upper channel UCH may be electrically connected to the first metal interconnect line 350c and the second metal interconnect line 360c. As the length of a channel increases, it may be hard to form a channel having a uniform width for the reason of processes. According to an embodiment, because the lower channel LCH and the upper channel UCH are formed by sequential processes, the memory device 500 may include a channel having increased width uniformity.

As shown in A2 of FIG. 23, when the channel structure CH includes the lower channel LCH and the upper channel UCH, a word line around the boundary between the lower channel LCH and the upper channel UCH may correspond to a dummy word line. For example, the word lines 332 and 333 around the boundary between the lower channel LCH and the upper channel UCH may correspond to dummy word lines. In this case, data may not be stored in memory cells connected to the dummy word lines. The number of pages corresponding to memory cells connected to dummy word lines may be less than the number of pages corresponding to memory cells connected to normal word lines. A voltage level applied to a dummy word line may be different from a voltage level applied to a normal word line, and accordingly, the influence of the non-uniform width of the lower and upper channels LCH and UCH on the operation of a memory device may decrease.

It is illustrated in A2 that the number of word lines 331 and 332 passed through by the lower channel LCH is less than the number of word lines 333 to 338 passed through by the upper channel UCH. However, it is just an example, and the inventive concept is not limited thereto. Alternatively, the number of lower word lines passed through by the lower channel LCH may be greater than or equal to the number of upper word lines passed through by the upper channel UCH. The structure and connection of the channel structure CH in the first cell region CELL1, which have been described above, may also be applied to channel structures CH in the second cell region CELL2.

In the bit line bonding area BLBA, a first through electrode THV1 and a second through electrode THV2 may be respectively in the first and second cell regions CELL1 and CELL2. The first through electrode THV1 may pass through the common source line 320 and the word lines 330. However, this is just an example, and the first through electrode THV1 may further pass through the second substrate 310. The first through electrode THV1 may include a conductive material. Alternatively, the first through electrode THV1 may include a conductive material surrounded by an insulating material. The shape and structure of the second through electrode THV2 may be the same as those of the first through electrode THV1.

In an embodiment, the first through electrode THV1 may be electrically connected to the second through electrode THV2 through a first through metal pattern 372d and a second through metal pattern 472d. The first through metal pattern 372d may be in the bottom of the first upper chip including the first cell region CELL1, and the second through metal pattern 472d may be in the top of the second upper chip including the second cell region CELL2. The first through electrode THV1 may be electrically connected to the first and second metal interconnect lines 350c and 360c. A lower via 371d may be between the first through electrode THV1 and the first through metal pattern 372d, and an upper via 471d may be between the second through electrode THV2 and the second through metal pattern 472d. The first through metal pattern 372d may be connected to the second through metal pattern 472d by a bonding manner.

In the bit line bonding area BLBA, an upper metal pattern 252 may be formed in an uppermost metal layer of the peripheral circuit region PERI, and an upper metal pattern 392, which has the same shape as the upper metal pattern 252, may be formed in an uppermost metal layer of the first cell region CELL. The upper metal pattern 392 of the first cell region CELL may be electrically connected to the upper metal pattern 252 of the peripheral circuit region PERI by a bonding manner. In the bit line bonding area BLBA, the bit line 360c may be electrically connected to a page buffer included in the peripheral circuit region PERI. For example, some of the circuit elements 220c of the peripheral circuit region PERI may provide a page buffer, and the bit line 360c may be electrically connected to the circuit elements 220c, which provide the page buffer, through an upper bonding metal 370c of the first cell region CELL and an upper bonding metal 270c of the peripheral circuit region PERI.

In the word line bonding area WLBA, the word lines 330 of the first cell region CELL may extend in a second direction (an X-axis direction), parallel with the top surface of the second substrate 310, and may be connected to a plurality of cell contact plugs 341 to 347 (i.e., 340). A first metal interconnect line 350b and a second metal interconnect line 360b may be sequentially connected to an upper portion of each of the cell contact plugs 340 respectively connected to the word lines 330. In the word line bonding area WLBA, the cell contact plugs 340 may be connected to the peripheral circuit region PERI by an upper bonding metal 370b of the first cell region CELL1 and an upper bonding metal 270b of the peripheral circuit region PERI.

The cell contact plugs 340 may be electrically connected to a row decoder included in the peripheral circuit region PERI. For example, some of the circuit elements 220b of the peripheral circuit region PERI may provide the row decoder, and the cell contact plugs 340 may be electrically connected to the circuit elements 220b, which provide the row decoder, by the upper bonding metal 370b of the first cell region CELL1 and the upper bonding metal 270b of the peripheral circuit region PERI. In an embodiment, operating voltages of the circuit elements 220b providing the row decoder may be different from operating voltages of the circuit elements 220c providing the page buffer. For example, operating voltages of the circuit elements 220c providing the page buffer may be greater than operating voltages of the circuit elements 220b providing the row decoder.

Similarly, in the word line bonding area WLBA, the word lines 430 of the second cell region CELL2 may extend in the second direction (the X-axis direction), parallel with the top surface of the third substrate 410, and may be connected to a plurality of cell contact plugs 441 to 447 (i.e., 440). The cell contact plugs 440 may be connected to the peripheral circuit region PERI by an upper metal pattern of the second cell region CELL2, a lower metal pattern and an upper metal pattern of the first cell region CELL1, and a cell contact plug 348.

In the word line bonding area WLBA, the upper bonding metal 370b may be formed in the first cell region CELL1, and the upper bonding metal 270b may be formed in the peripheral circuit region PERI. The upper bonding metal 370b of the first cell region CELL1 and the upper bonding metal 270b of the peripheral circuit region PERI may be electrically connected to each other by a bonding manner. The upper bonding metals 370b and 270b may include aluminum, copper, or tungsten.

In the external pad bonding area PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by a bonding manner in the external pad bonding area PA. Similarly, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by a bonding manner.

Common source line contact plugs 380 and 480 may be in the external pad bonding area PA. The common source line contact plugs 380 and 480 may include a conductive material, such as metal, a metal compound, or doped polysilicon. The common source line contact plug 380 of the first cell region CELL1 may be electrically connected to the common source line 320, and the common source line contact plug 480 of the second cell region CELL2 may be electrically connected to the common source line 420. A first metal interconnect line 350a and a second metal interconnect line 360a may be sequentially stacked above the common source line contact plug 380 of the first cell region CELL1, and a first metal interconnect line 450a and a second metal interconnect line 460a may be sequentially stacked above the common source line contact plug 480 of the second cell region CELL2.

First to third I/O pads 205, 405, and 406 may be in the external pad bonding area PA. A lower insulating film 201 may cover the bottom surface of the first substrate 210, and the first I/O pad 205 may be formed on the lower insulating film 201. The first I/O pad 205 may be connected to at least one of the circuit elements 220a of the peripheral circuit region PERI by a first I/O contact plug 203 and may be separated from the first substrate 210 by the lower insulating film 201. A side insulating film may be between the first I/O contact plug 203 and the first substrate 210 and thus electrically separate the first I/O contact plug 203 and the first substrate 210.

An upper insulating film 401 may be on the third substrate 410 to cover the top surface of the third substrate 410. The second I/O pad 405 and/or the third I/O pad 406 may be on the upper insulating film 401. The second I/O pad 405 may be connected to at least one of the circuit elements 220a of the peripheral circuit region PERI by second I/O contact plugs 403 and 303, and the third I/O pad 406 may be connected to at least one of the circuit elements 220a of the peripheral circuit region PERI by third I/O contact plugs 404 and 304.

In an embodiment, the third substrate 410 may not be formed in a region, in which an I/O contact plug is arranged.

For example, as shown in B of FIG. 23, the third I/O contact plug 404 may be separated from the third substrate 410 in a direction parallel with the top surface of the third substrate 410 and may pass through an interlayer insulating layer 415 of the second cell region CELL2 to be connected to the third I/O pad 406. In this case, the third I/O contact plug 404 may be formed by various processes.

For example, as shown in B1 of FIG. 23, the third I/O contact plug 404 may extend in a third direction (e.g., the Z-axis direction) and have a diameter increasing toward the upper insulating film 401. In other words, while the diameter of the channel structure CH described with reference to A1 decreases toward the upper insulating film 401, the diameter of the third I/O contact plug 404 may increase toward the upper insulating film 401. For example, the third I/O contact plug 404 may be formed after the second cell region CELL2 is connected to the first cell region CELL1 by a bonding manner.

For example, as shown in B2 of FIG. 23, the third I/O contact plug 404 may extend in the third direction (e.g., the Z-axis direction) and have a diameter decreasing toward the upper insulating film 401. In other words, the diameter of the third I/O contact plug 404 may decrease toward the upper insulating film 401 like the diameter of the channel structure CH. For example, the third I/O contact plug 404 may be formed together with the cell contact plugs 440 before the second cell region CELL2 is connected to the first cell region CELL1 by a bonding manner.

In some embodiments, an I/O contact plug may overlap with the third substrate 410. For example, as shown in C of FIG. 23, the second I/O contact plug 403 may pass through the interlayer insulating layer 415 of the second cell region CELL2 in the third direction (the Z-axis direction) and may be electrically connected to the second I/O pad 405 through the third substrate 410. In this case, a connection structure of the second I/O contact plug 403 and the second I/O pad 405 may be implemented in various manners.

For example, as shown in C1 of FIG. 23, an opening 408 may be formed through the third substrate 410, and the second I/O contact plug 403 may be directly connected to the second I/O pad 405 through the opening 408 formed in the third substrate 410. In this case, as shown in C1 of FIG. 23, the diameter of the second I/O contact plug 403 may increase toward the second I/O pad 405. However, this is just an example, and the diameter of the second I/O contact plug 403 may decrease toward the second I/O pad 405.

For example, as shown in C2 of FIG. 23, the opening 408 may be formed through the third substrate 410, and a contact 407 may be formed in the opening 408. An end of the contact 407 may be connected to the second I/O pad 405, and an opposite end of the contact 407 may be connected to the second I/O contact plug 403. Accordingly, the second I/O contact plug 403 may be electrically connected to the second I/O pad 405 by the contact 407 in the opening 408. In this case, as shown in C2 of FIG. 23, the diameter of the contact 407 may increase toward the second I/O pad 405, and the diameter of the second I/O contact plug 403 may decrease toward the second I/O pad 405. For example, the second I/O contact plug 403 may be formed together with the cell contact plugs 440 before the second cell region CELL2 is connected to the first cell region CELL1 by a bonding manner, and the contact 407 may be formed after the second cell region CELL2 is connected to the first cell region CELL1 by the bonding manner.

For example, as shown in C3 of FIG. 23, a stopper 409 may be further formed on the top surface of the opening 408 of the third substrate 410 compared to C2 of FIG. 23. The stopper 409 may include a metal interconnect line formed in the same layer as the common source line 420. However, this is just an example, and the stopper 409 may include a metal interconnect line formed in the same layer as at least one of the word lines 430. The second I/O contact plug 403 may be electrically connected to the second I/O pad 405 by the contact 407 and the stopper 409.

Similar to the second and third I/O contact plugs 403 and 404 of the second cell region CELL2, each of the second and third I/O contact plugs 303 and 304 of the first cell region CELL1 may have a diameter increasing or decreasing toward the lower metal pattern 371e.

According to embodiments, a slit 411 may be formed in the third substrate 410. For example, the slit 411 may be formed in a random position in the external pad bonding area PA. As shown in D of FIG. 23, the slit 411 may be between the second I/O pad 405 and the cell contact plugs 440 in a plan view. However, this is just an example, and the second I/O pad 405 may be between the slit 411 and the cell contact plugs 440 in a plan view.

As shown in D1 of FIG. 23, the slit 411 may pass through the third substrate 410. For example, the slit 411 may be used to prevent the third substrate 410 from finely cracking when the opening 408 is formed. However, this is just an example, and the slit 411 may be formed to have a depth of about 60% to about 70% of the thickness of the third substrate 410.

As shown in D2 of FIG. 23, a conductive material 412 may be formed in the slit 411. For example, the conductive material 412 may be used to discharge leakage current, which is generated while circuit elements of the external pad bonding area PA are operating. In this case, the conductive material 412 may be connected to an external ground line.

As shown in D3 of FIG. 23, an insulating material 413 may be formed in the slit 411. For example, the insulating material 413 may be formed to electrically separate the second I/O pad 405 and the second I/O contact plug 403 in the external pad bonding area PA from the word line bonding area WLBA. When the insulating material 413 is formed in the slit 411, a voltage provided through the second I/O pad 405 may be prevented from influencing a metal layer on the third substrate 410 in the word line bonding area WLBA.

According to embodiments, the first to third I/O pads 205, 405, and 406 may be selectively formed. For example, the memory device 500 may include only the first I/O pad 205 above the first substrate 210, only the second I/O pad 405 above the third substrate 410, or only the third I/O pad 406 on the upper insulating film 401.

According to embodiments, at least one selected from the group consisting of the second substrate 310 of the first cell region CELL1 and the third substrate 410 of the second cell region CELL2 may be used as a sacrificial substrate and entirely or partially removed before or after a bonding process. An additional film may be stacked on a resultant structure after the sacrificial substrate is removed. For example, the second substrate 310 of the first cell region CELL1 may be removed before or after the bonding between the peripheral circuit region PERI and the first cell region CELL1, and an insulating film covering the top surface of the common source line 320 or a conductive film for connection to the common source line 320 may be formed.

Similarly, the third substrate 410 of the second cell region CELL2 may be removed before or after the bonding between the first cell region CELL1 and the second cell region CELL2, and the upper insulating film 401 covering the top surface of the common source line 420 or a conductive film for connection to the common source line 420 may be formed.

While the inventive concept has been particularly shown and described with reference to embodiments thereof, it will be understood that various changes in form and details may be made thereto without departing from the spirit and scope of the inventive concept as set forth in the following claims.

What is claimed is:

1. An operating method of a storage device including a memory controller and a non-volatile memory, the operating method comprising:
    performing a first read operation in response to a read request of a host by reading data from the non-volatile memory based on a default read voltage set; and
    performing a second read operation when the first read operation fails, by calculating a degradation compensation level, based on at least one weight table, at least one offset table, and a displacement level, calculating a history read voltage set by performing an operation on the default read voltage set and the degradation compensation level, and reading the data based on the history read voltage set,
    wherein the at least one weight table includes weights preset according to word line groups and state read voltages, the at least one offset table includes offset levels preset according to the word line groups and the state read voltages, and the displacement level corresponds to a difference between a default read voltage level in the default read voltage set and an optimal read voltage level in an optimal read voltage set.

2. The operating method of claim 1, wherein
    the performing of the second read operation includes:
    selecting a weight from the at least one weight table, according to a word line corresponding to a physical page storing the data;
    selecting an offset level from the at least one offset table, according to the word line; and
    calculating the degradation compensation level, based on the selected weight, the selected offset level, and the displacement level.

3. The operating method of claim 2, wherein
    the calculating of the degradation compensation level includes
    calculating the degradation compensation level by applying the selected weight, the selected offset level, and the displacement level to a preset operational function.

4. The operating method of claim 2, wherein
    the calculating of the degradation compensation level includes
    applying the selected weight, the selected offset level, and the displacement level to a pre-trained machine learning model and calculating, as the degradation compensation level, a value output from the pre-trained machine learning model.

5. The operating method of claim 1, wherein
    the at least one weight table is a plurality of weight tables, and the at least one offset table is a plurality of offset tables, and
    the performing of the second read operation includes
    selecting a weight table from the plurality of weight tables, according to a degradation parameter, and
    selecting an offset table from the plurality of offset tables, according to the degradation parameter.

6. The operating method of claim 5, wherein
    the plurality of weight tables include
    a first weight table and a second weight table,
    a weight in the first weight table is less than a weight in the second weight table with respect to one word line group and one state read voltage,
    the plurality of offset tables include
    a first offset table and a second offset table,
    an offset level in the first offset table is lower than an offset level in the second offset table with respect to the one word line group and the one state read voltage,
    the selecting of the weight table includes
    selecting the first weight table when a value of the degradation parameter is in a first range and
    selecting the second weight table when the value of the degradation parameter is in a second range having a minimum value greater than a maximum value of the first range, and
    the selecting of the offset table includes
    selecting the first offset table when the value of the degradation parameter is in the first range and
    selecting the second offset table when the value of the degradation parameter is in the second range.

7. The operating method of claim 1, further comprising, when the second read operation is a fail,
    searching for a new optimal read voltage set by executing recovery code, calculating and storing, as the displacement level, a value corresponding to a shift from the default read voltage level in the default read voltage set to an optimal read voltage level in the new optimal read voltage set, and performing a third read operation based on the new optimal read voltage set.

8. The operating method of claim 1, wherein
    the default read voltage set includes
    first to n-th default read voltages, where "n" is a natural number of at least 2,
    wherein a degradation compensation level corresponding to an i-th default read voltage is lower than a degradation compensation level corresponding to a j-th default read voltage, where "i" is an integer that is greater than or equal to I and less than or equal to n-1 and "j" is an integer that is greater than "i" and less than or equal to "n".

9. The operating method of claim 1, wherein,
    as a vertical level of a word line corresponding to a physical page storing the data increases in distance from a lower substrate of the non-volatile memory, the degradation compensation level corresponding to the word line decreases.

10. A memory controller for controlling a non-volatile memory including a plurality of word lines, the memory controller comprising:
    a memory storing at least one weight table including weights corresponding to word line groups and state read voltages, at least one offset table including offset levels corresponding to the word line groups and the state read voltages, and a displacement level corresponding to a difference between a default read voltage level in a default read voltage set and an optimal read voltage level in an optimal read voltage set; and
    a read manager configured to control the non-volatile memory to read data from the non-volatile memory in response to a read request of a host,
    wherein the read manager is further configured to
    calculate a degradation compensation level based on the at least one weight table, the at least one offset table, and the displacement level, calculate a history read voltage set by performing an operation on the default read voltage set and the degradation compensation level, and control the non-volatile memory to perform a history read operation by reading the data based on the history read voltage set.

11. The memory controller of claim 10, wherein the read manager is further configured to select a weight from the at least one weight table, according to a selected word line among the plurality of word lines, the selected word line corresponding to a physical page storing the data, select an offset level from the at least one offset table, according to the selected word line, and calculate the degradation compensation level, based on the selected weight, the selected offset level, and the displacement level.

12. The memory controller of claim 10, wherein the memory stores a plurality of weight tables and a plurality of offset tables and the memory further stores, in each of a plurality of memory blocks, a degradation parameter table including degradation parameter values, wherein the read manager is further configured to detect a degradation parameter of a selected memory block in the degradation parameter table, the selected memory block including a selected word line corresponding to a physical page storing the data among the plurality of memory blocks, select a weight table from the plurality of weight tables, according to the degradation parameter of the selected memory block, and select an offset table from the plurality of offset tables, according to the degradation parameter of the selected memory block.

13. The memory controller of claim 10, further comprising an error correction code circuit configured to detect and correct an error in the data, wherein the memory further stores a recovery code, and the read manager is further configured to determine whether the history read operation passes, according to whether the error is corrected, and when the history read operation fails, the read manager is further configured to search for a new optimal read voltage set by executing the recovery code, calculate and store, as the displacement level, a value corresponding to a shift from the default read voltage level in the default read voltage set to an optimal read voltage level in the new optimal read voltage set, and read the data based on the new optimal read voltage set.

14. The memory controller of claim 13, wherein the read manager is further configured to update the memory according to the displacement level calculated by using the recovery code.

15. The memory controller of claim 10, wherein the default read voltage set includes first to n-th default read voltages, where "n" is a natural number of at least 2, wherein a degradation compensation level corresponding to an i-th default read voltage is lower than a degradation compensation level corresponding to a j-th default read voltage, where "i" is an integer that is greater than or equal to 1 and less than or equal to n-1 and "j" is an integer that is greater than "i" and less than or equal to "n".

16. The memory controller of claim 10, wherein, as a vertical level of a word line corresponding to a physical page storing the data increases in distance from a lower substrate of the non-volatile memory, the degradation compensation level corresponding to the word line decreases.

17. A storage device comprising:

a non-volatile memory including a plurality of memory blocks each connected to a plurality of word lines; and a memory controller configured to control the non-volatile memory to read data from the non-volatile memory in response to a read request of a host, wherein the memory controller is further configured to calculate a degradation compensation level, based on a weight table, an offset table, and a displacement level, the weight table including weights corresponding to word line groups and state read voltages, the offset table including offset levels corresponding to the word line groups and the state read voltages, and the displacement level corresponding to a difference between a default read voltage level in a default read voltage set and an optimal read voltage level in an optimal read voltage set, calculate a history read voltage set by performing an operation on the default read voltage set and the degradation compensation level, and control the non-volatile memory to read the data based on the history read voltage set.

18. The storage device of claim 17, wherein the memory controller is further configured to select a weight from the weight table, according to a selected word line among the plurality of word lines, the selected word line corresponding to a physical page storing the data, select an offset level from the offset table, according to the selected word line, and calculate the degradation compensation level, based on the selected weight, the selected offset level, and the displacement level.

19. The storage device of claim 18, wherein the memory controller is further configured to apply the selected weight to the displacement level and calculate the degradation compensation level by performing an operation on a result of the application, the selected offset level, and the displacement level.

20. The storage device of claim 19, wherein the memory controller is further configured to detect and correct an error in the data, determine whether a read operation of the non-volatile memory passes, according to whether the error is corrected, search for a new optimal read voltage set by executing a recovery code when the read operation fails, control the non-volatile memory to read the data based on the new optimal read voltage set, and calculate and store, as the displacement level, a value corresponding to a shift from the default read voltage level in the default read voltage set to an optimal read voltage level in the new optimal read voltage set.

* * * * *